(12) United States Patent
Nishikawa et al.

(10) Patent No.: US 9,620,512 B1
(45) Date of Patent: Apr. 11, 2017

(54) FIELD EFFECT TRANSISTOR WITH A MULTILEVEL GATE ELECTRODE FOR INTEGRATION WITH A MULTILEVEL MEMORY DEVICE

(71) Applicant: SANDISK TECHNOLOGIES INC., Plano, TX (US)

(72) Inventors: Masatoshi Nishikawa, Yokkaichi (JP); Hiroaki Koketsu, Yokkaichi (JP); Fumiaki Toyama, Cupertino, CA (US); Junji Oh, Yokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/925,224

(22) Filed: Oct. 28, 2015

(51) Int. Cl.
| | |
|---|---|
| *H01L 27/11* | (2006.01) |
| *H01L 27/11524* | (2017.01) |
| *H01L 27/11582* | (2017.01) |
| *H01L 27/11556* | (2017.01) |
| *H01L 27/1157* | (2017.01) |

(52) U.S. Cl.
CPC .... *H01L 27/11524* (2013.01); *H01L 27/1157* (2013.01); *H01L 27/11556* (2013.01); *H01L 27/11582* (2013.01)

(58) Field of Classification Search
CPC ............ H01L 27/115; H01L 27/11524; H01L 27/11556; H01L 27/1157; H01L 27/11582; H01L 27/00
USPC ................................ 257/190, 314, 316, 365
See application file for complete search history.

(56) References Cited

U.S. PATENT DOCUMENTS

| | | |
|---|---|---|
| 5,915,167 A | 6/1999 | Leedy |
| 7,005,350 B2 | 2/2006 | Walker et al. |
| 7,023,739 B2 | 4/2006 | Chen et al. |
| | (Continued) | |

FOREIGN PATENT DOCUMENTS

WO  WO02/15277 A2  2/2002

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.

(Continued)

*Primary Examiner* — Julio J Maldonado
*Assistant Examiner* — Rodolfo D Fortich
(74) *Attorney, Agent, or Firm* — The Marbury Law Group PLLC

(57) ABSTRACT

A switching field effect transistor and the memory devices can be formed employing a same set of processing steps. An alternating stack of insulating layers and sacrificial material layers is formed over a substrate. Memory stack structures for memory devices and gate dielectric-channel structures for the field effect transistor can be simultaneously formed in a memory region and in a transistor region, respectively. After replacement of the sacrificial material layers with electrically conductive layers, portions of the electrically conductive layers in a memory region are electrically isolated from one another to provide independently controlled control gate electrodes for the memory devices, while portions of the electrically conductive layers in the transistor region are electrically shorted among one another to provide a single gate electrode for the switching field effect transistor.

14 Claims, 20 Drawing Sheets

(56) References Cited

U.S. PATENT DOCUMENTS

| | | | |
|---|---|---|---|
| 7,177,191 B2 | 2/2007 | Fasoli et al. | |
| 7,221,588 B2 | 5/2007 | Fasoli et al. | |
| 7,233,522 B2 | 6/2007 | Chen et al. | |
| 7,514,321 B2 | 4/2009 | Mokhlesi et al. | |
| 7,575,973 B2 | 8/2009 | Mokhlesi et al. | |
| 7,696,559 B2 | 4/2010 | Arai et al. | |
| 7,745,265 B2 | 6/2010 | Mokhlesi et al. | |
| 7,808,038 B2 | 10/2010 | Mokhlesi et al. | |
| 7,848,145 B2 | 12/2010 | Mokhlesi et al. | |
| 7,851,851 B2 | 12/2010 | Mokhlesi et al. | |
| 8,008,710 B2 | 8/2011 | Fukuzumi | |
| 8,053,829 B2 | 11/2011 | Kang et al. | |
| 8,187,936 B2 | 5/2012 | Alsmeier et al. | |
| 8,394,716 B2 | 3/2013 | Hwang et al. | |
| 8,643,142 B2 | 2/2014 | Higashitani et al. | |
| 8,878,278 B2 | 11/2014 | Alsmeier et al. | |
| 9,023,719 B2 | 5/2015 | Pachamuthu et al. | |
| 2007/0210338 A1 | 9/2007 | Orlowski | |
| 2007/0252201 A1 | 11/2007 | Kito et al. | |
| 2009/0230449 A1 | 9/2009 | Sakaguchi et al. | |
| 2009/0242967 A1 | 10/2009 | Katsumata et al. | |
| 2010/0044778 A1 | 2/2010 | Seol | |
| 2010/0112769 A1 | 5/2010 | Son et al. | |
| 2010/0120214 A1 | 5/2010 | Park et al. | |
| 2010/0155810 A1 | 6/2010 | Kim et al. | |
| 2010/0155818 A1 | 6/2010 | Cho | |
| 2010/0181610 A1 | 7/2010 | Kim et al. | |
| 2010/0207195 A1 | 8/2010 | Fukuzumi et al. | |
| 2010/0320528 A1 | 12/2010 | Jeong et al. | |
| 2011/0076819 A1 | 3/2011 | Kim et al. | |
| 2011/0133606 A1 | 6/2011 | Yoshida et al. | |
| 2011/0266606 A1 | 11/2011 | Park et al. | |
| 2012/0001247 A1 | 1/2012 | Alsmeier | |
| 2012/0001249 A1 | 1/2012 | Alsmeier | |
| 2012/0001250 A1 | 1/2012 | Alsmeier | |
| 2012/0012920 A1 | 1/2012 | Shin et al. | |
| 2012/0119287 A1 | 5/2012 | Park et al. | |
| 2012/0280304 A1 | 11/2012 | Lee et al. | |
| 2013/0264631 A1* | 10/2013 | Alsmeier | H01L 21/28282 257/324 |
| 2015/0076584 A1 | 3/2015 | Pachamuthu et al. | |
| 2015/0076586 A1 | 3/2015 | Rabkin et al. | |
| 2015/0179660 A1 | 6/2015 | Yada et al. | |
| 2015/0206895 A1 | 7/2015 | Oh et al. | |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) 33-36.

Tanaka et al., "Bit-Cost Scalable Technology for Low-Cost and Ultrahigh-Density Flash Memory," Toshiba Review, vol. 63, No. 2, 2008, pp. 28-31.

Kimura, "3D Cells Make Terabit NAND Flash Possible," Nikkei Electronics Asia, Sep. 17, 2009, 6pgs.

International Search Report & Written Opinion, PCT/US2011/042566, Jan. 17, 2012.

Invitation to Pay Additional Fees & Partial International Search Report, PCT/US2011/042566, Sep. 28, 2011.

International Search Report, PCT/US2013/035567, Sep. 30, 2013, 6pgs.

U.S. Appl. No. 14/517,134, filed Oct. 17, 2014, SanDisk Technologies Inc.

U.S. Appl. No. 14/723,868, filed May 28, 2015, SanDisk Technologies Inc.

U.S. Appl. No. 14/739,284, filed Jun. 15, 2015, SanDisk Technologies, Inc.

U.S. Appl. No. 14/739,354, filed Jun. 15, 2015, SanDisk Technologies Inc.

International Search Report and Written Opinion of the International Searching Authority for International Patent Application No. PCT/US2016/049052, dated Nov. 25, 2016, 12 pages.

* cited by examiner

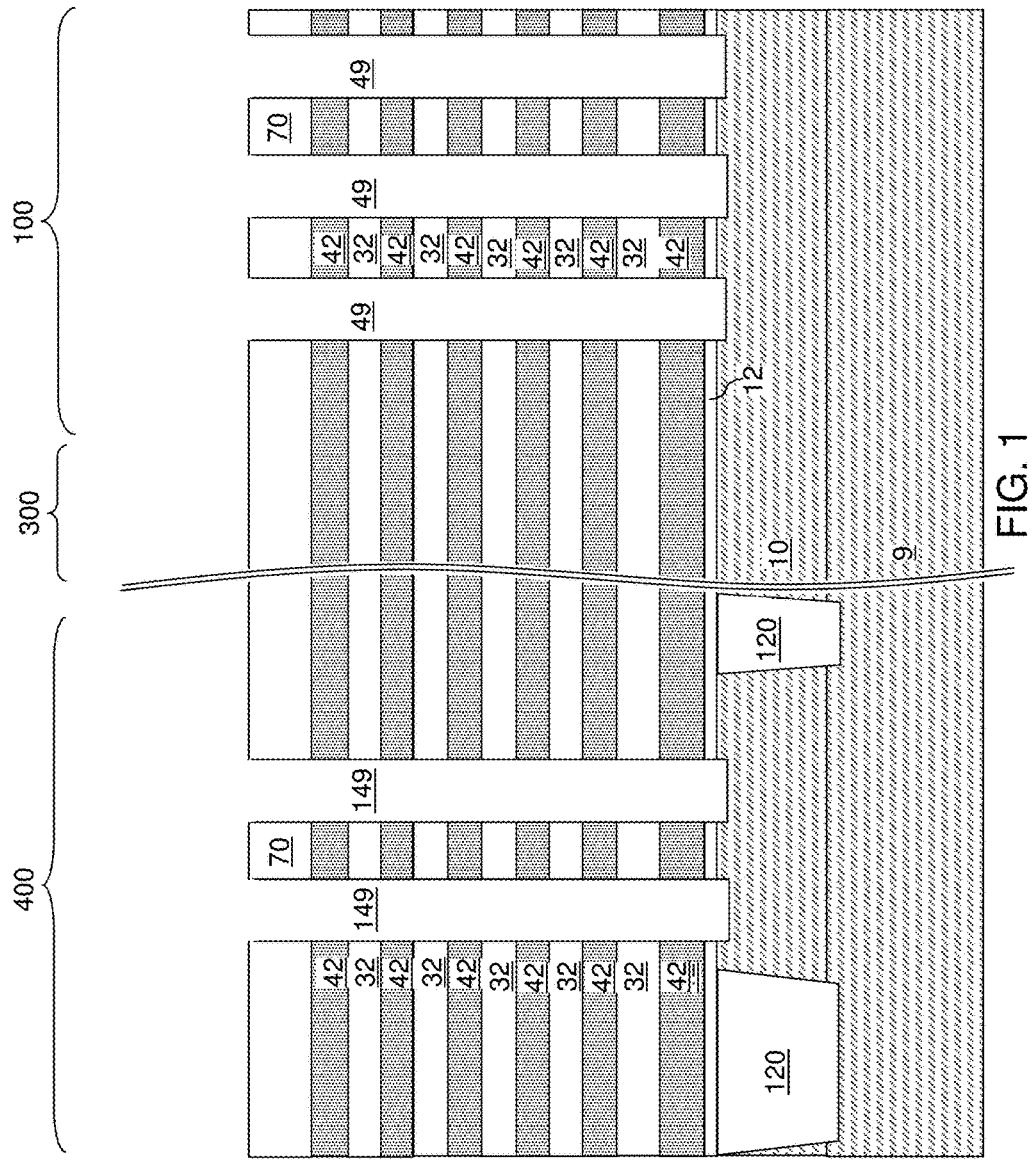

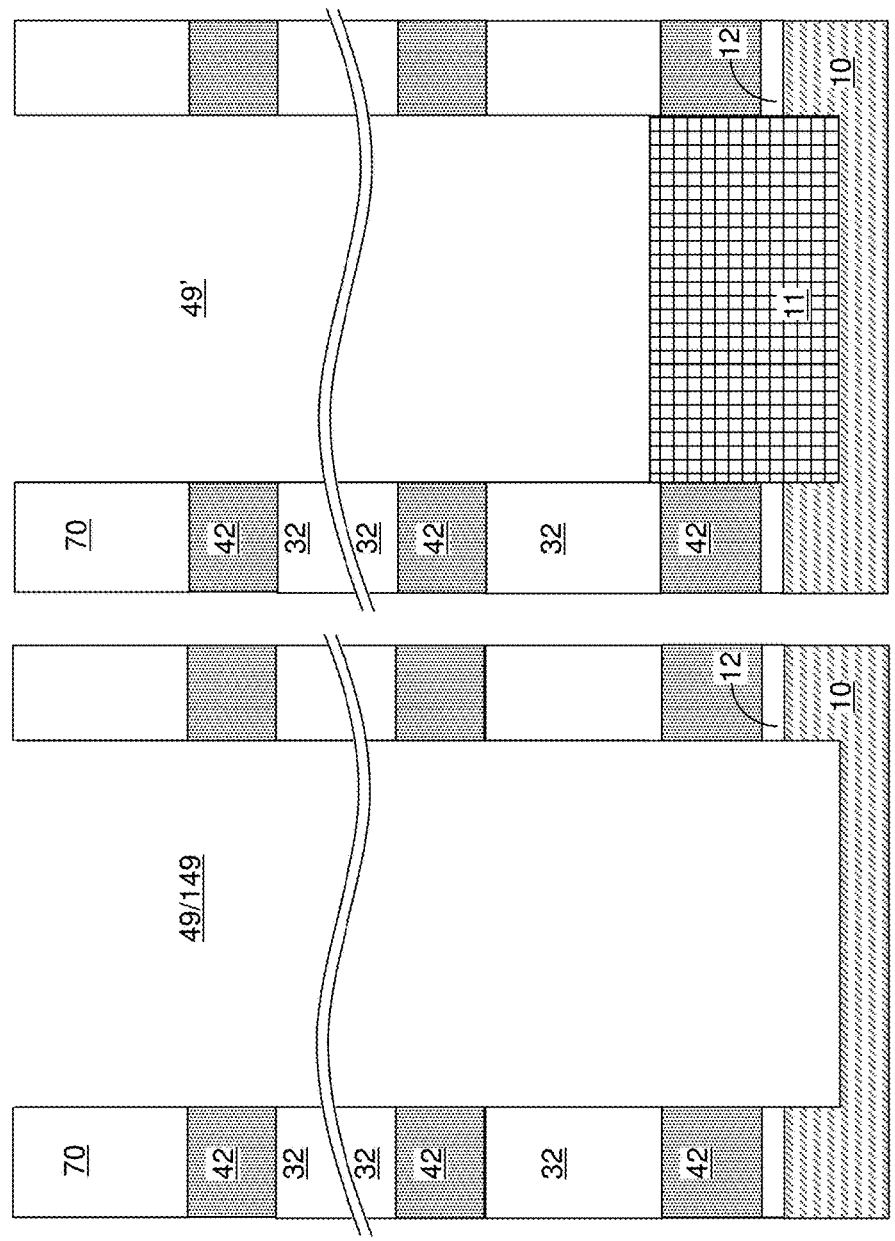

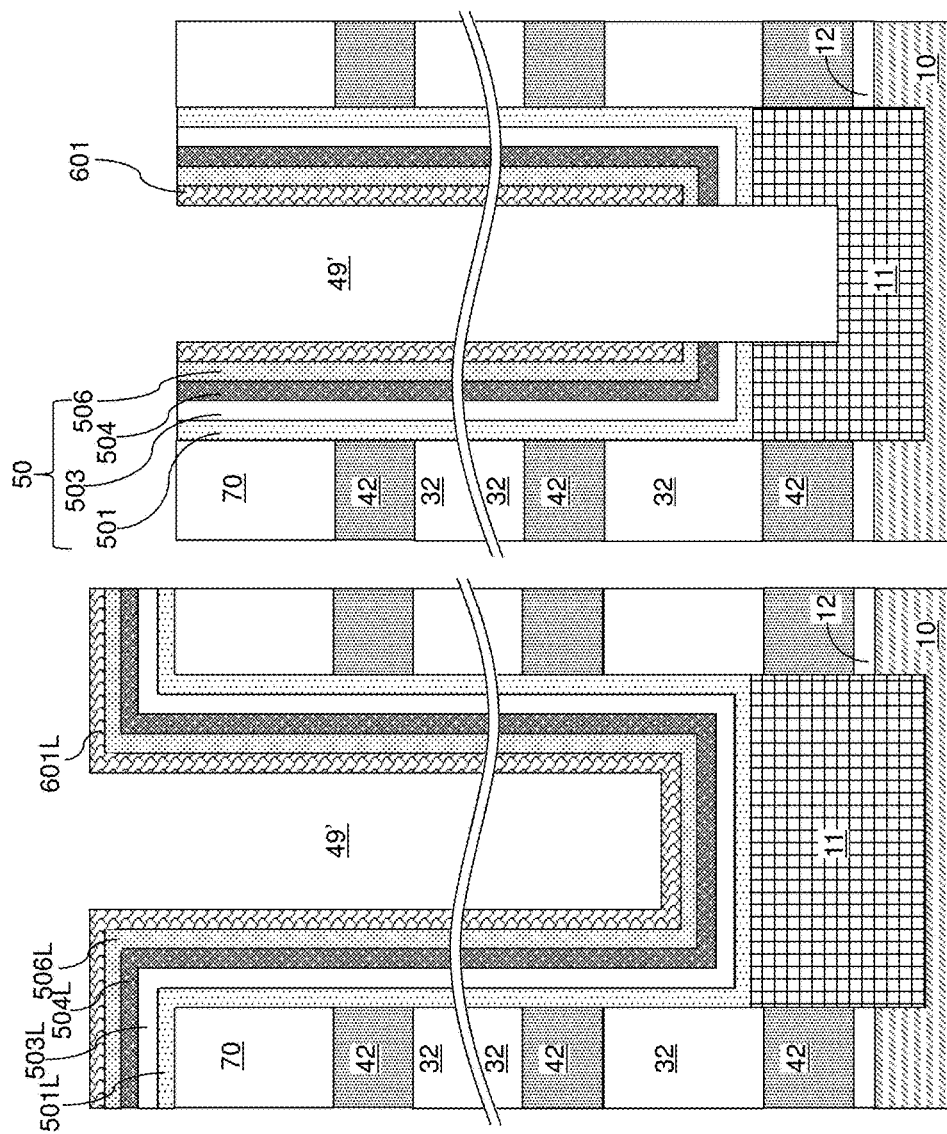

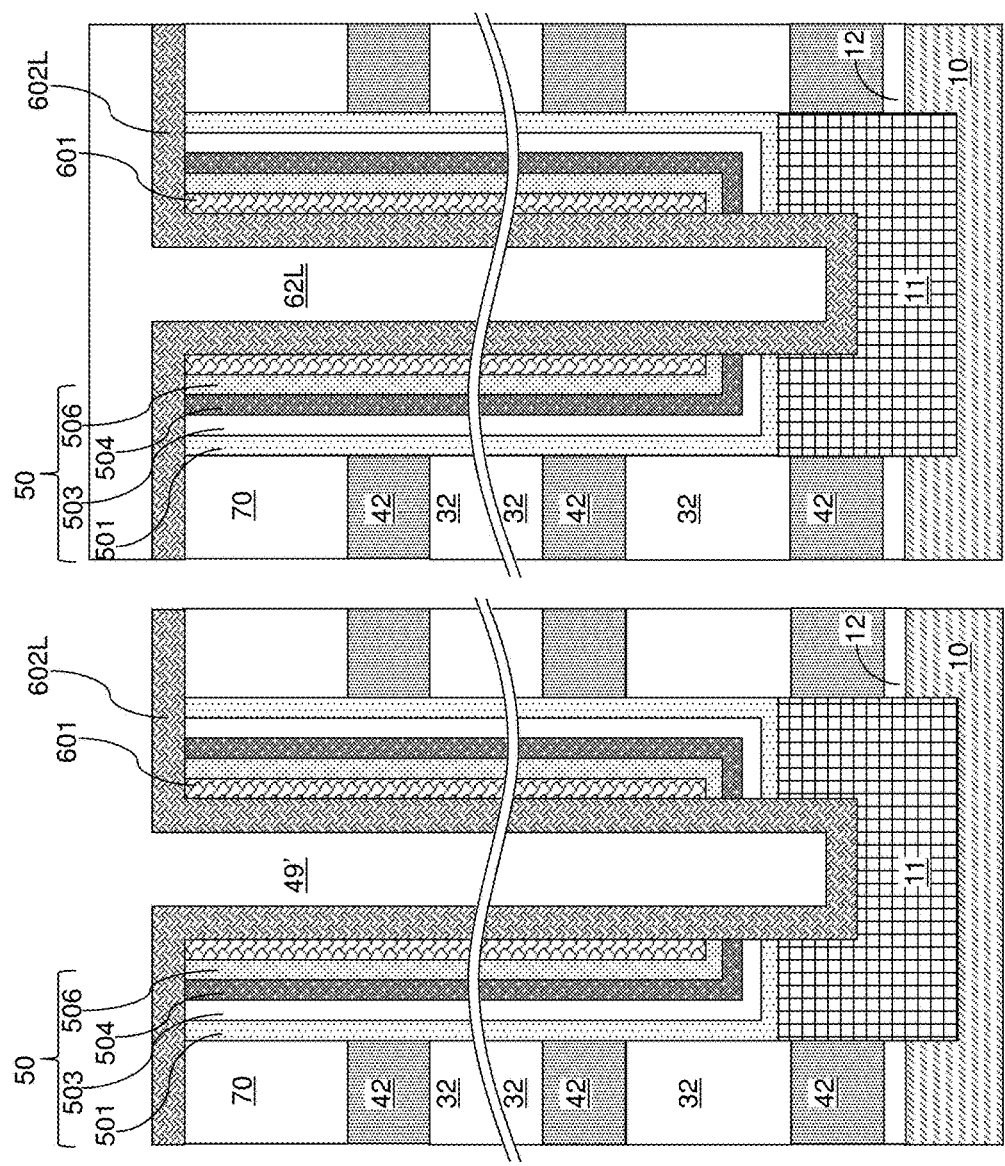

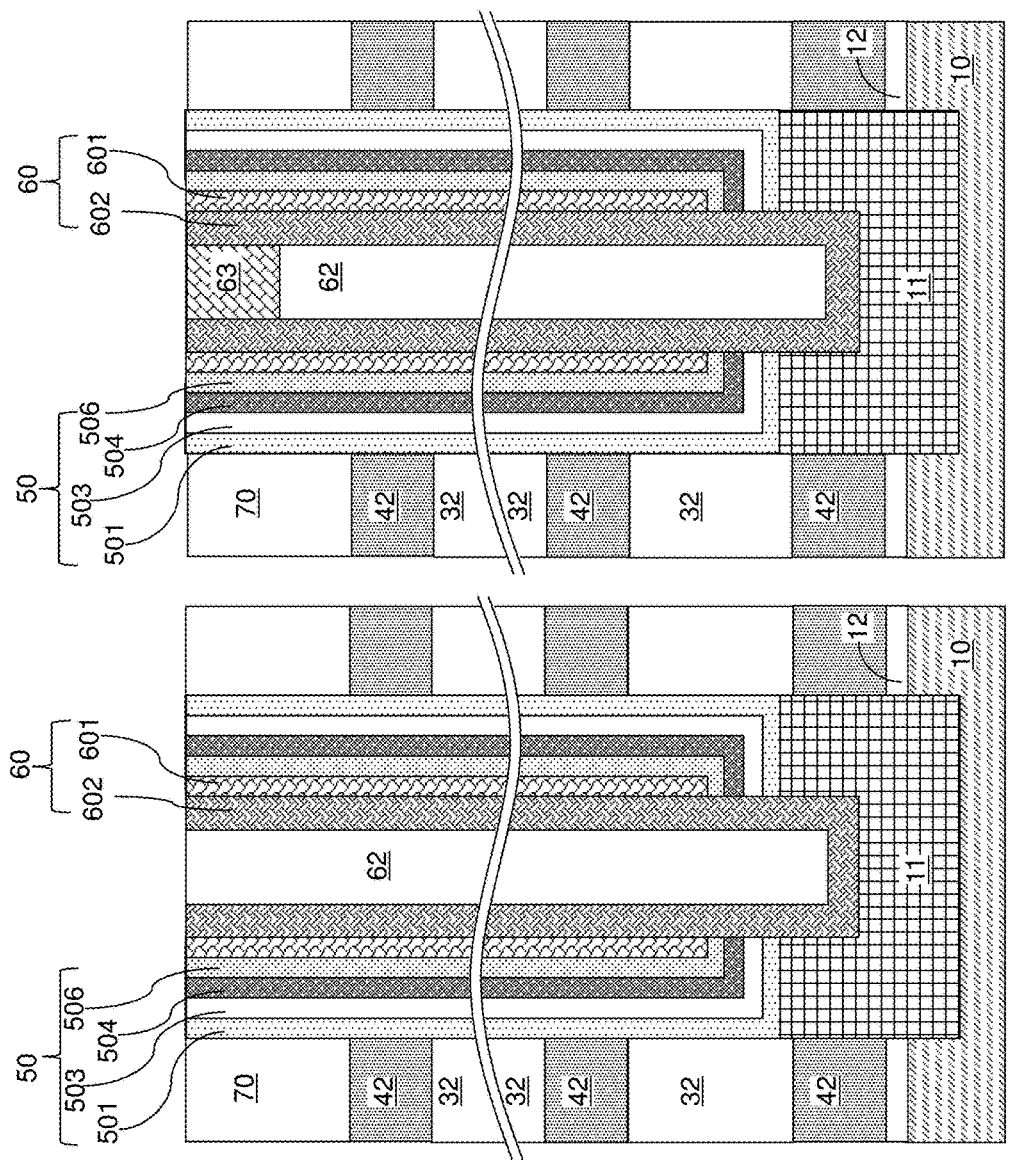

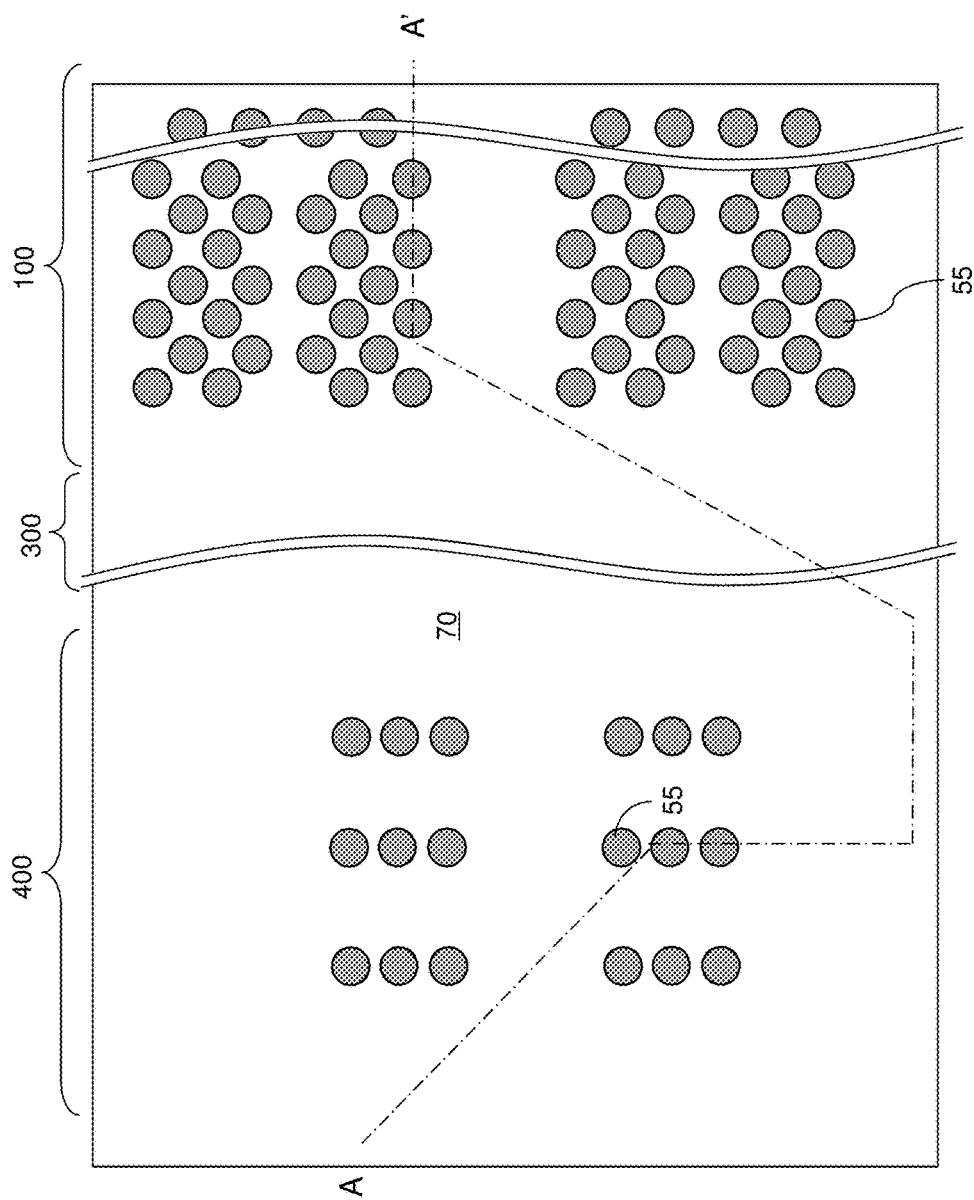

FIELD EFFECT TRANSISTOR WITH A MULTILEVEL GATE ELECTRODE FOR INTEGRATION WITH A MULTILEVEL MEMORY DEVICE

FIELD

The present disclosure relates generally to the field of semiconductor devices and specifically to a field effect transistor compatible with three-dimensional memory structures such as vertical NAND strings and other three-dimensional devices, and methods of making thereof.

BACKGROUND

Three-dimensional semiconductor devices employ multiple device levels on a same semiconductor substrate. An exemplary three-dimensional semiconductor devices is a three-dimensional vertical NAND strings having one bit per cell, which are disclosed in an article by T. Endoh, et. al., titled "Novel Ultra High Density Memory With A Stacked-Surrounding Gate Transistor (S-SGT) Structured Cell", IEDM Proc. (2001) 33-36. In many cases, peripheral devices including field effect transistors are needed to operate a three-dimensional semiconductor device. Methods of providing such peripheral devices using a small device area and with minimal additional processing steps are desired.

SUMMARY

According to an aspect of the present disclosure, a device comprising a field effect transistor is provided. The field effect transistor comprises a first vertical transistor channel portion extending through a first portion of an alternating stack of electrically conductive layers and insulating layers located over a substrate, wherein at least some of the electrically conductive layers are electrically shorted among one another to provide a gate electrode, a first gate dielectric laterally surrounding the first vertical transistor channel portion, a gate electrode contact structure extending through the first portion of the alternating stack and contacting at least some of the electrically conductive layers to electrically short at least some of the electrically conductive layers, a bottom active region located in, or on, the substrate and laterally spaced from the first vertical transistor channel portion, and a first top active region overlying the first vertical transistor channel portion. One of the top and bottom active regions is a source region of the field effect transistor and another of the top and bottom active regions is a drain region of the field effect transistor.

In one embodiment, the device further comprises a three-dimensional memory device. The three-dimensional memory device comprises a second portion of the alternating stack of insulating layers and electrically conductive layers that are electrically isolated from one another and from the electrically conductive layers of the first portion of the alternating stack, and at least one memory stack structure vertically extending through the second portion of the alternating stack, wherein each of the at least one memory stack structure comprises, from inside to outside, a memory device channel and a memory film. The memory film comprises a tunneling dielectric laterally surrounding the memory device channel and charge storage regions laterally surrounding the tunneling dielectric. The three-dimensional memory device comprises a three dimensional NAND device. The field effect transistor comprises a word line switching transistor for the three dimensional NAND device. The electrically conductive layers in the second portion of the stack comprise word lines of the three dimensional NAND device. At least one word line of the three dimensional NAND device is electrically connected by an interconnect to the source or drain region of the word line switching transistor.

According to an aspect of the present disclosure, a method of manufacturing a device is provided. An alternating stack of insulating layers and sacrificial material layers is formed over a substrate. A device opening is formed through the alternating stack. A gate dielectric of a field effect transistor is formed around a periphery of the device opening. A vertical transistor channel of the field effect transistor is formed within a cavity inside the gate dielectric. The sacrificial material layers are replaced with electrically conductive layers. A gate electrode contact structure is formed through the alternating stack. At least some of the electrically conductive layers are electrically shorted by the gate electrode contact structure, and collectively constitute a gate electrode of the field effect transistor.

According to an aspect of the present disclosure, a method of making a switching transistor and memory devices during a same set of processing steps is provided. The method comprises forming an alternating stack of insulating layers and sacrificial material layers over a substrate, forming memory openings in a memory region and a device opening in a transistor region in the alternating stack during the same etching step, forming memory stack structures for memory devices in the memory openings and forming at least one gate dielectric-channel structure for the switching transistor in the device opening during the same deposition step, replacing the sacrificial material layers with electrically conductive layers, isolating portions of the electrically conductive layers in the memory region from portions of the electrically conductive layers in the transistor region to provide independently controlled control gate electrodes for the memory devices in the memory region, and electrically shorting portions of the electrically conductive layers in the transistor region to provide a single gate electrode for the switching transistor in the transistor region.

BRIEF DESCRIPTION OF THE DRAWINGS

FIG. 1 is a vertical cross-sectional view of an exemplary structure after formation of an alternating stack of insulating layers and sacrificial material layers, and memory openings and device openings extending through the alternating stack according to an embodiment of the present disclosure.

FIGS. 2A-2H are sequential vertical cross-sectional views of a memory opening or a device opening within the exemplary structure during various processing steps employed to form an opening fill structure according to an embodiment of the present disclosure.

FIG. 3B is a top-down view of the exemplary structure of FIG. 3A.

DETAILED DESCRIPTION

Figure 3A:
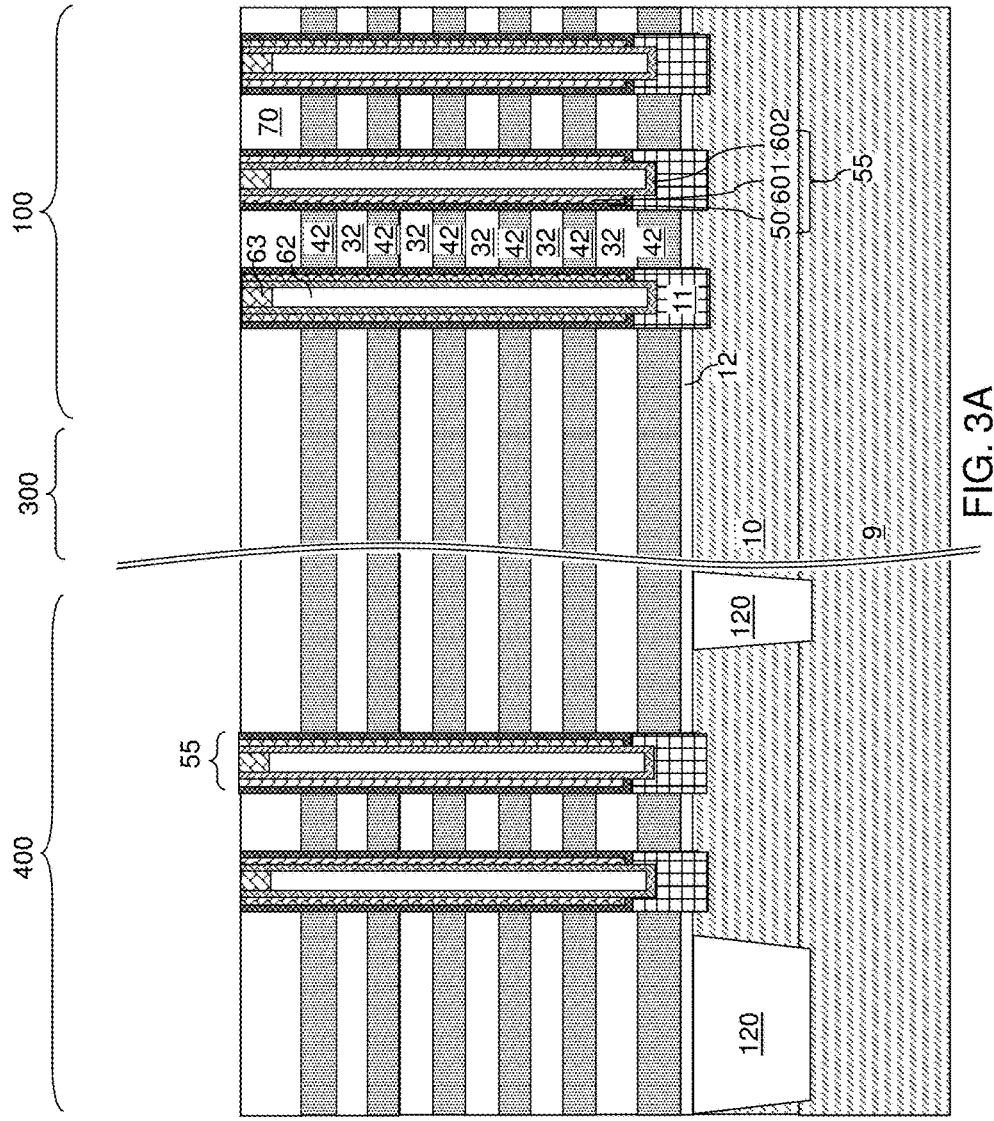
FIG. 3A is a vertical cross-sectional view of the exemplary structure after formation of opening fill structures according to an embodiment of the present disclosure.

As discussed above, the present disclosure is directed to three-dimensional memory structures, such as vertical NAND strings and other three-dimensional devices, and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region which may have a substantially uniform thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "field effect transistor" refers to any semiconductor device having a semiconductor channel through which electrical current flows with a current density modulated by an external electrical field. As used herein, an "active region" refers to a source region of a field effect transistor or a drain region of a field effect transistor. A "top active region" refers to an active region of a field effect transistor that is located above another active region of the field effect transistor. A "bottom active region" refers to an active region of a field effect transistor that is located below another active region of the field effect transistor. A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, an exemplary structure according to an embodiment of the present disclosure is illustrated, which can be employed, for example, to fabricate a device structure containing vertical NAND memory devices. The exemplary structure includes a substrate, which can be a semiconductor substrate (such as a single crystalline silicon wafer). The substrate can include a substrate semiconductor layer 9. The substrate semiconductor layer 9 is a semiconductor material layer, and can include at least one elemental semiconductor material (e.g., silicon, such as single crystalline silicon), at least one III-V compound semiconductor material, at least one II-VI compound semiconductor material, at least one organic semiconductor material, or other semiconductor materials known in the art.

As used herein, a "semiconductor material" refers to a material having electrical conductivity in the range from $1.0 \times 10^{-6}$ S/cm to $1.0 \times 10^{5}$ S/cm, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulating material" or a "dielectric material" refers to a material having electrical conductivity less than $1.0 \times 10^{-6}$ S/cm. All measurements for electrical conductivities are made at the standard condition. The substrate semiconductor layer 9 can include at least one doped well (not expressly shown) having a substantially uniform dopant concentration therein.

The exemplary structure can have multiple regions for building different types of devices. Such areas can include, for example, a memory region 100, a contact region 300, and a transistor region 400. The transistor region 400 may be a peripheral region, such as a row decoder region containing word line switching transistors which switch word lines of a NAND memory device on and off. In one embodiment, the substrate semiconductor layer 9 can include at least one a doped well in the memory region 100. As used herein, a "doped well" refers to a portion of a semiconductor material having a doping of a same conductivity type (which can be p-type or n-type) and a substantially same level of dopant concentration throughout. The doped well can be the same as the substrate semiconductor layer 9 or can be a portion of the substrate semiconductor layer 9. The conductivity type of the doped well is herein referred to as a first conductivity type, which can be p-type or n-type. The dopant concentration level of the doped well is herein referred to as a first dopant concentration level. In one embodiment, the first dopant concentration level can be in a range from $1.0 \times 10^{15}/\text{cm}^3$ to $1.0 \times 10^{18}/\text{cm}^3$, although lesser and greater dopant concentration levels can also be employed. As used herein, a dopant concentration level refers to average dopant concentration for a given region.

At least one semiconductor device for additional peripheral circuitry can be formed on or over a portion of the substrate semiconductor layer 9. The additional peripheral circuitry may include sense amplifiers and bit line peripheral devices, such as bit line switching transistors. The at least one semiconductor device can include, for example, field effect transistors for switching bit lines on and off. The at least one semiconductor device for the peripheral circuitry can contain a driver circuit for memory devices to be subsequently formed, which can include at least one NAND device.

An optional semiconductor well layer 10 can be formed on the top surface of the substrate semiconductor layer 9 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor well layer 10 can be in epitaxial alignment with the single crystalline structure of the substrate semiconductor layer 9.

At least a portion of the semiconductor well layer 10 located in the memory region 100 is a doped well. As used herein, a "doped well" refers to a portion of a semiconductor material having a doping of a same conductivity type (which can be p-type or n-type) and a substantially same level of dopant concentration throughout. The doped well can be the same as the semiconductor well layer 10 or can be a portion of the semiconductor well layer 10, or, in case the semiconductor well layer 10 is omitted, can be a portion of the substrate semiconductor layer 9. The conductivity type of the doped well is herein referred to as a first conductivity type, which can be p-type or n-type. The dopant concentration level of the doped well is herein referred to as a first dopant concentration level. In one embodiment, the first dopant concentration level can be in a range from $1.0 \times 10^{15}/\text{cm}^3$ to $1.0 \times 10^{18}/\text{cm}^3$, although lesser and greater dopant concentration levels can also be employed. As used herein, a dopant concentration level refers to average dopant concentration for a given region.

At least one shallow trench isolation structure 120 can be formed in upper portions of the substrate (9, 10). For example, the at least one shallow trench isolation structure 120 can be formed in the semiconductor material layer, for example, by forming shallow trenches and filling the shallow trenches with a dielectric material such as silicon oxide and/or silicon nitride. In one embodiment, the at least one shallow trench isolation structure 120 can be formed at a periphery of the transistor region 400 to electrically isolate the portion of the substrate (9, 10) within the transistor region 400 from adjoining regions in the substrate (9, 10). In one embodiment, a shallow trench isolation structure 120 can be formed in a moat configuration to provide a portion of the semiconductor well layer 10 that is laterally surrounded by the shallow trench isolation structure 120.

Optionally, a horizontal gate dielectric layer 12 can be formed above the substrate semiconductor layer 9 (e.g., above the well layer 10). The horizontal gate dielectric layer 12 can be employed as the gate dielectric for a source select gate electrode. The horizontal gate dielectric layer 12 can include, for example, silicon oxide and/or a dielectric metal oxide (such as $HfO_2$, $ZrO_2$, $LaO_2$, etc.). The thickness of the horizontal gate dielectric layer 12 can be in a range from 3 nm to 30 nm, although lesser and greater thicknesses can also be employed.

An alternating stack of first material layers (which can be insulating layers 32) and second material layers (which are referred to spacer material layers) is formed over the top surface of the substrate, which can be, for example, on the top surface of the gate dielectric layer 12. As used herein, a "material layer" refers to a layer including a material throughout the entirety thereof. As used herein, a "spacer material layer" refers to a material layer that is located between two other material layers, i.e., between an overlying material layer and an underlying material layer. The spacer material layers can be formed as electrically conductive layers, or can be replaced with electrically conductive layers in a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer 42. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as a set of independently biased control gate electrodes of a vertical NAND device or as a set of electrically conductive layers that are electrically shorted to one another for a single gate electrode of a vertical field effect transistor. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the top surface of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

A lithographic material stack (not shown) including at least a photoresist layer can be formed over the insulating cap layer 70 and the alternating stack (32, 42), and can be lithographically patterned to form openings therein. The pattern in the lithographic material stack can be transferred through the insulating cap layer 70 and through entirety of the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 in the memory region 100 and to form device openings 149 in the transistor region 400. In other words, the transfer of the pattern in the patterned lithographic material stack through the alternating stack (32, 42) simultaneously forms the memory openings 49 and the device openings 149 that extend through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. Optionally, the horizontal gate dielectric layer 12 may be used as an etch stop layer between the alternating stack (32, 42) and the substrate. The sidewalls of the first memory openings can be substantially vertical, or can be tapered. The patterned lithographic material stack can be subsequently removed, for example, by ashing. The lateral dimensions (e.g., a diameter) of the memory openings 49 may be the same as, or may be different from, the corresponding lateral dimensions of the device openings 149.

An opening fill structure can be formed in each of the memory openings 49 and the device openings 149. A memory opening fill structure can be formed in each of the memory openings 49, and a device opening fill structure can be formed in each of the device openings 149. As used herein, a "memory opening fill structure" refers to a structure that fills a memory opening. As used herein, a "device opening fill structure" refers to a structure that fills a device opening.

FIGS. 2A-2H illustrate sequential vertical cross-sectional views of an opening (49 or 149) through the alternating stack (32, 43), which may be a memory opening 49 or a device opening 149, during formation of an opening fill structure therein. The same opening fill structure can be formed in all the memory openings 49 and the device openings 149 during the same process steps with possible changes in dimension caused by the differences in the lateral dimensions of each opening. In one embodiment, each opening fill structure that is formed in a memory opening 49 can constitute a memory stack structure, and each device opening fill structure that is formed in a device opening 149 can constitute a gate dielectric-channel structure. As used herein, a "memory stack structure" refers to a structure including a stack of memory elements. As used herein, a "gate dielectric-channel structure" refers to a structure including at least one component of a gate dielectric structure and at least one component of a channel of a transistor. A memory stack structure and a gate dielectric-channel structure can have the same components and the same configuration, although the lateral dimensions (e.g., a diameter) of the memory stack structure may be the same as, or may be different from, the corresponding lateral dimensions of the gate dielectric-channel structure. Exemplary opening fill structure can fill each of the memory openings 49 and each of the device openings 149 in the exemplary structure illustrated in FIG. 1.

Referring to FIG. 2A, an opening (49/149) is illustrated, which may be a memory opening 49 or a device opening 149. The opening (49/149) extends through the insulating cap layer 70, the alternating stack (32, 42), and the gate dielectric layer 12, and optionally into an upper portion of the substrate (e.g., into the semiconductor well layer 10). The recess depth of the bottom surface of each opening (49/149) with respect to the top surface of the substrate (e.g., the top surface of the semiconductor well layer 10) can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 2B, an epitaxial channel portion 11 can be optionally formed at the bottom of each opening (49/149) by selective epitaxy of a semiconductor material. During the selective epitaxy process, a reactant gas and an etchant gas can be simultaneously or alternatively flowed into a process chamber. Semiconductor surfaces and dielectric surfaces of the exemplary structure provide different nucleation rates for the semiconductor material. By setting the etch rate (determined by the flow of the etchant gas) of the semiconductor material greater than the nucleation rate of the semiconductor material on the dielectric surfaces and less than the nucleation rate of the semiconductor material on the semiconductor surfaces, the semiconductor material can grow from the physically exposed semiconductor surfaces (i.e., from the physically exposed surfaces of the semiconductor well layer 10 at the bottom of each opening (49/149)). Each portion of the deposited semiconductor material constitutes an epitaxial channel portion 11, which comprises a single crystalline semiconductor material (e.g., single crystalline silicon) in epitaxial alignment with the single crystalline semiconductor material (e.g., single crystalline silicon) of the substrate semiconductor layer 9. Each epitaxial channel portion 11 functions as a portion of a channel of a field effect transistor. The top surface of the epitaxial channel portion 11 can be between a pair of sacrificial material layers 42. In other words, a periphery of each epitaxial channel portion 11 can be in physical contact with a sidewall of an insulating layer 32. A cavity 49' is present over an epitaxial channel portion 11 in each opening (49/149).

Referring to FIG. 2C, a continuous layer stack (i.e., a stack of continuous layers) is formed in the openings (49, 149) and over the insulating cap layer 70. The continuous layer stack can include at least one optional outer dielectric layer (501L, 503L), a continuous intermediate material layer 504L, and an inner dielectric layer 506L. The continuous layer stack can include dielectric materials that can be employed as a gate dielectric material in the device openings 149 and as a memory film in the memory openings 49.

The at least one outer dielectric layer (501L, 503L) can include, for example, a first outer dielectric layer 501L and a second outer dielectric layer 503L. In an illustrative example, the first outer dielectric layer 501L can be deposited on the sidewalls of each opening (49/149) by a conformal deposition method. Each of the at least one outer dielectric layer (501L, 503L) can include a dielectric material that can function as a blocking dielectric material, which is a gate dielectric material for a control gate of a memory device including a charge storage region. The first outer dielectric layer 501L includes a dielectric material, which can be a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the first outer dielectric layer 501L can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The first outer dielectric layer 501L can be deposited, for example, by chemical vapor deposition (CVD), atomic layer deposition (ALD), pulsed laser deposition (PLD), liquid source misted chemical deposition, or a combination thereof. The thickness of the first outer dielectric layer 501L can be in a range from 1 nm to 20 nm, although lesser and greater thicknesses can also be employed. The first outer dielectric layer 501L can subsequently function as a dielectric material portion that blocks leakage of stored electrical charges to control gate electrodes. In one embodiment, the first outer dielectric layer 501L includes aluminum oxide.

The second outer dielectric layer 503L can be formed on the first outer dielectric layer 501L. The second outer dielectric layer 503L can include a dielectric material that is different from the dielectric material of the first outer dielectric layer 501L. In one embodiment, the second outer dielectric layer 503L can include silicon oxide, a dielectric metal oxide having a different composition than the first outer dielectric layer 501L, silicon oxynitride, silicon nitride, or a combination thereof. In one embodiment, the second outer dielectric layer 503L can include silicon oxide. The second outer dielectric layer 503L can be formed by a conformal deposition method such as low pressure chemical vapor deposition, atomic layer deposition, or a combination thereof. The thickness of the second outer dielectric layer 503L can be in a range from 1 nm to 20 nm, although lesser and greater thicknesses can also be employed. Alternatively, the first outer dielectric layer 501L and/or the second outer dielectric layer 503L can be omitted, and an outer dielectric layer can be formed after formation of backside recesses on surfaces of memory films to be subsequently formed.

The continuous intermediate material layer 504L, the inner dielectric layer 506L, and the optional first semiconductor channel layer 601L can be sequentially formed. The continuous intermediate material layer 504L can include a memory material, i.e., can be a memory material layer. As used herein, a "memory material" refers to a material that can store information, for example, by trapping electrical charges therein. In one embodiment, the continuous intermediate material layer 504L can be a charge trapping material including a dielectric charge trapping material, which can be, for example, silicon nitride. Alternatively, the continuous intermediate material layer 504L can include a conductive material such as doped polysilicon or a metallic material that is patterned into multiple electrically isolated portions (e.g., floating gates), for example, by being formed within lateral recesses into sacrificial material layers 42. In one embodiment, the continuous intermediate material layer 504L includes a silicon nitride layer.

The continuous intermediate material layer 504L can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the continuous intermediate material layer 504L may comprise an insulating charge trapping material, such as one or more silicon nitride segments. The continuous intermediate material layer 504L can be formed, for example, by chemical vapor deposition (CVD), atomic layer deposition (ALD), physical vapor deposition (PVD), or any suitable deposition technique for storing electrical charges therein. The thickness of the continuous intermediate material layer 504L can be in a range from 2 nm to 20 nm, although lesser and greater thicknesses can also be employed.

The inner dielectric layer 506L includes a dielectric material through which charge tunneling can be performed under suitable electrical bias conditions. The inner dielectric layer 506L can be a tunneling dielectric layer through which electrical charges can tunnel. The charge tunneling may be performed through hot-carrier injection or by Fowler-Nordheim tunneling induced charge transfer depending on the mode of operation of the monolithic three-dimensional NAND string memory device to be formed. The inner dielectric layer 506L can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the inner dielectric layer 506L can include a stack of a first silicon oxide layer, a silicon oxynitride layer, and a second silicon oxide layer, which is commonly known as an ONO stack. In one embodiment, the inner dielectric layer 506L can include a silicon oxide layer that is substantially free of carbon or a silicon oxynitride layer that is substantially free of carbon. The thickness of the inner dielectric layer 506L can be in a range from 2 nm to 20 nm, although lesser and greater thicknesses can also be employed. Thus, a combination blocking dielectric-charge storage layer-tunnel dielectric is formed in openings 49 while a multi-layer gate dielectric film is formed in openings 149 at the same time.

An optional first semiconductor channel layer 601L can be sequentially deposited in the openings (49, 149) directly on the inner dielectric layer 506L. The optional first semiconductor channel layer 601L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601L includes amorphous silicon or polysilicon. The first semiconductor channel layer 601L can be formed by a conformal deposition method such as low pressure chemical vapor deposition (LPCVD). The thickness of the first semiconductor channel layer 601L can be in a range from 2 nm to 10 nm, although lesser and greater thicknesses can also be employed. A cavity 49' is formed in the volume of each opening (49/149) that is not filled with the deposited material layers (501L, 503L, 504L, 506L, 601L).

Referring to FIG. 2D, within each opening (49, 149) through the alternating stack (32, 46), the optional first semiconductor channel layer 601L, the inner dielectric layer 506L, the continuous intermediate material layer 504L, the at least one outer dielectric layer (501L, 503L) are sequentially anisotropically etched employing at least one anisotropic etch process. The portions of the first semiconductor channel layer 601L, the inner dielectric layer 506L, the continuous intermediate material layer 504L, and the at least one outer dielectric layer (501L, 503L) located above the top surface of the insulating cap layer 70 can be removed by the at least one anisotropic etch process. Further, the horizontal portions of the first semiconductor channel layer 601L, the inner dielectric layer 506L, the continuous intermediate material layer 504L, and the at least one outer dielectric layer (501L, 503L) at a bottom of each cavity 49' can be removed to form openings in remaining portions thereof. Each of the first semiconductor channel layer 601L, the inner dielectric layer 506L, the continuous intermediate material layer 504L, and the at least one outer dielectric layer (501L, 503L) can be etched by anisotropic etch process.

Each remaining portion of the first semiconductor channel layer 601L constitutes a first semiconductor channel portion 601. Each remaining portion of the inner dielectric layer 506L constitutes an inner dielectric 506. Each inner dielectric 506 in the memory region 100 can be a tunneling dielectric for a memory device to be subsequently completed. Each inner dielectric 506 in the transistor region 400 can be an inner layer of a gate dielectric for a field effect transistor to be subsequently completed. Each remaining portion of the continuous intermediate material layer 504L is herein referred to as an intermediate material layer 504. The intermediate material layer 504 can comprise a charge trapping material or a floating gate material. In one embodiment, each intermediate material layer 504 in the memory region 100 can be a memory material layer for the memory device to be subsequently completed, and each intermediate material layer 504 in the transistor region 400 can be an intermediate layer of the gate dielectric for the field effect transistor to be subsequently completed. In one embodiment, each intermediate material layer 504 in the memory region 100 can include a vertical stack of charge storage regions that store electrical charges upon programming. In one embodiment, each intermediate material layer 504 in the memory region 100 can be a charge storage layer in which each portion adjacent to the sacrificial material layers 42 constitutes a charge storage region. Each remaining portion of the second outer dielectric layer 503L is herein referred to as a second outer dielectric 503. Each remaining portion of the first outer dielectric layer 501L is herein referred to as a first outer dielectric 501. In one embodiment, each of the at least one outer dielectric (501, 503) in the memory region 100 can be at least one blocking dielectric layer for the memory device to be subsequently completed, and each of the at least one outer dielectric (501, 503) in the transistor region 400 can be an outer layer of the gate dielectric for the field effect transistor to be subsequently completed.

A surface of the epitaxial channel portion 11 (or a surface of the semiconductor well layer 10 in case the epitaxial channel portions 11 are not employed) can be physically exposed underneath the opening through the first semiconductor channel portion 601, the inner dielectric 506, the intermediate material layer 504, and the at least one outer dielectric (501, 503). Optionally, the physically exposed semiconductor surface at the bottom of each cavity 49' can be vertically recessed so that the recessed semiconductor surface underneath the cavity 49' is vertically offset from the topmost surface of the epitaxial channel portion 11 (or of the semiconductor well layer 10 in case epitaxial channel portions 11 are not employed) by a recess distance. An inner dielectric 506 is located over the intermediate material layer 504. A set of at least one outer dielectric (501, 503), an intermediate material layer 504, and an inner dielectric 506 in an opening (49, 149) constitutes a layer stack 50. The layer stacks 50 in the memory region 100 are memory films, each of which includes a plurality of charge storage regions (as embodied as the intermediate material layer 504), at least one outer dielectric (501, 503), and an inner dielectric 506, and can store information in the form of presence or absence of electrical charges in each charge storage region. Each layer stack 50 in the transistor region 400 is a gate dielectric, which includes at least one outer dielectric (501, 503), an intermediate material layer 504, and an inner dielectric layer 506. The at least one outer dielectric (501, 503) in a layer stack 50 in the transistor region 400 is an outer gate dielectric. The intermediate material layer 504 in a layer stack 50 in the transistor region 400 is a middle gate dielectric. The inner dielectric layer 506 in a layer stack 50 in the transistor region 400 is an inner gate dielectric.

In the embodiment shown in FIG. 3A, the same layer stacks 50 act as both a gate dielectric for a transistor in region 400 and as a memory film in the memory region 100. In an alternative embodiment, the transistor gate dielectric in region 400 may comprise different layer or layers from those of the stack 50 of the memory film. In this alternative embodiment, the memory openings 49 in region 100 are filled with a sacrificial material, such as silicon oxide and/or polysilicon, while device openings 149 in region 400 remain unfilled and exposed. The gate dielectric layer or layers (e.g., a thick silicon oxide layer and/or a metal oxide layer for high voltage switching transistors) and the vertical channel are then sequentially formed in the exposed openings 149 in region 400. The sacrificial material is then removed from the openings 49 in region 100 and the memory stack structures 55 are formed in the openings 49 in region 100.

In one embodiment, the first semiconductor channel portion 601, the inner dielectric 506, the intermediate material layer 504, the second outer dielectric 503, and the first outer dielectric 501 within a same memory opening (49, 149) can have vertically coincident sidewalls. As used herein, a first surface is "vertically coincident" with a second surface if there exists a vertical plane including both the first surface and the second surface. Such a vertical plane may, or may not, have a horizontal curvature, but does not include any curvature along the vertical direction, i.e., extends straight up and down.

Referring to FIG. 2E, within each opening (49, 149) through the alternating stack (32, 42), a second semiconductor channel layer 602L can be deposited directly on the semiconductor surface of the epitaxial channel portion 11 (or of the semiconductor well layer 10 if portion 11 is omitted), and directly on the first semiconductor channel portion 601. The second semiconductor channel layer 602L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602L includes amorphous silicon or polysilicon. The second semiconductor channel layer 602L can be formed by a conformal deposition method such as low pressure chemical vapor deposition (LPCVD). The thickness of the second semiconductor channel layer 602L can be in a range from 2 nm to 10 nm, although lesser and greater thicknesses can also be employed. The second semiconductor channel layer 602L may partially fill the cavity 49' in each opening (49, 149), or may fully fill the cavity in each opening (49, 149).

The materials of the first semiconductor channel portion 601 and the second semiconductor channel layer 602L are collectively referred to as a semiconductor channel material. In other words, the semiconductor channel material is a set of all semiconductor material in the first semiconductor channel portion 601 and the second semiconductor channel layer 602L.

Referring to FIG. 2F, in case the cavity 49' in each memory opening is not completely filled by the second semiconductor channel layer 602L, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 2G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602L located above the top surface of the insulating cap layer 70 can be removed by a planarization process, which can employ a recess etch or chemical mechanical planarization (CMP). Each remaining portion of the second semiconductor channel layer 602L within a memory opening constitutes a second semiconductor channel portion 602. Each adjoining pair of a first semiconductor channel portion 601 and a second semiconductor channel portion 602 can collectively form a semiconductor channel 60. In one embodiment, each semiconductor channel 60 in the memory region 100 is a channel of a memory device (e.g., a channel of a NAND string), and is herein referred to as a memory device channel. In one embodiment, each semiconductor channel 60 in the transistor region 400 is a channel of a vertical transistor, and is herein referred to as a vertical transistor channel. The vertical transistor may be a word line switching transistor when region 400 is a peripheral row decoder region (i.e., a word line switching region).

At least one memory device is formed in the memory region 100. For example, one or more vertical NAND devices can be formed in the memory region 100. Electrical current can flow through each semiconductor channel 60 (which is a memory device channel) when a vertical NAND device including the semiconductor channel 60 is turned on. An inner dielectric 506 (which can be tunneling dielectric) is surrounded by an intermediate material layer 504 (which can be a memory material layer), and laterally surrounds a portion of the semiconductor channel 60. Each adjoining set of a first outer dielectric 501 (which can be a first blocking dielectric), a second outer dielectric 503 (which can be a second blocking dielectric), an intermediate material layer 504 (which can be a memory material layer), and an inner dielectric 506 (which can be a tunneling dielectric layer) collectively constitute a layer stack (which is herein referred to as a memory film, i.e., a film that including a memory material in at least portions thereof), which can store electrical charges with a macroscopic retention time. In some embodiments, a first outer dielectric 501 and/or a second outer dielectric 503 may not be present in the layer stack 50 at this step, and an outer dielectric may be subsequently formed after formation of backside recesses. As used herein, a macroscopic retention time refers to a retention time suitable for operation of a memory device as a permanent memory device such as a retention time in excess of 24 hours.

Referring to FIG. 2H, the top surface of each dielectric core 62 can be further recessed within each memory opening, for example, by a recess etch to a depth that is located between the top surface of the insulating cap layer 70 and the bottom surface of the insulating cap layer 70. Top active regions 63 can be formed by depositing a doped semiconductor material within each recessed region above the dielectric cores 62. The top active regions 63 can be source regions or drain regions of a respective field effect transistor. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the top active regions 63.

Multiple instances of the exemplary opening fill structure 55 can be embedded into the exemplary structure illustrated in FIG. 1, i.e., into each instance of the memory openings 49 and the device openings 149. FIGS. 3A and 3B illustrate the exemplary structure that incorporates multiple instances of the exemplary opening fill structure of FIG. 2H. Each exemplary opening fill structure 55 includes a semiconductor channel (601, 602); an inner dielectric layer 506 laterally surrounding the semiconductor channel (601, 602); and a vertical stack of charge storage regions laterally surrounding the inner dielectric layer 506 (as embodied as an intermediate material layer 504). The exemplary structure includes a semiconductor device, which comprises a stack (32, 42) including an alternating plurality of material layers (e.g., the sacrificial material layers 42) and insulating layers 32 located over a semiconductor substrate (e.g., over the substrate semiconductor layer 9), and a memory opening extending through the stack (32, 42). The semiconductor device further comprises a first outer dielectric 501 vertically extending from a bottommost layer (e.g., the bottommost sacrificial material layer 42) of the stack to a topmost layer (e.g., the topmost sacrificial material layer 42) of the stack, and contacting a sidewall of the memory opening and a horizontal surface of the semiconductor substrate. While the present disclosure is described employing the illustrated configuration for the opening fill structure, the methods of the present disclosure can be applied to alternative opening fill structures including a vertical transistor channel.

Each layer stack 50 is a remaining portion of a continuous layer stack (501L, 503L, 504L, 506L), and can be formed by anisotropically etching the continuous layer stack (501L, 503L, 504L, 506L). In one embodiment, a plurality of device openings 149 can be formed in the transistor region 400, and a gate dielectric (as embodied by an instance of a layer stack 50) can be formed within each device opening 149 in the transistor region 400. The vertical transistor channels and the memory device channels have the same composition, and can be formed simultaneously. The vertical transistor channel of the field effect transistor(s) and each memory device channel of the memory device(s) can be formed by deposition and patterning of the same semiconductor material(s). Each vertical transistor channel and each memory device channel is a remaining portion of the optional first semiconductor channel layer 601L and the second semiconductor channel layer 602L that remains in a device opening 149 or a memory opening 49 after formation of the opening fill structures 55.

Each gate dielectric (as embodied as an instance of a layer stack 50 in the transistor region 400) and each vertical transistor channel (as embodied as a semiconductor channel 60 in the transistor region 400) are formed directly on the epitaxial channel portion 11 within a device opening 149. Each memory film (as embodied as an instance of a layer stack 50 in the memory region 100) and each memory device channel (as embodied as a semiconductor channel 60 in the memory region 100) are formed directly on the epitaxial channel portion 11 within a memory opening 49. Each gate dielectric of a field effect transistor can be a layer stack 50 around a periphery of a respective device opening 149. Each vertical transistor channel of the field effect transistor can be formed within a cavity inside a respective gate dielectric.

At least one memory stack structure (as embodied as an opening fill structure 55) is formed within the memory region 100. Each of the at least one memory stack structure vertically extends through the alternating stack (32, 42). Each of the at least one memory stack structure comprises, from inside to outside, a memory device channel (as embodied as an instance of the semiconductor channels 60), and a memory film (as embodied as an instance of the layer stack 50). Each memory film can include a tunneling dielectric (as embodied as an instance of an inner dielectric 506) laterally surrounding the memory device channel, and a vertical stack of charge storage regions laterally surrounding the tunneling dielectric (as embodied as discrete portions of the intermediate material layer (i.e., a memory material layer) located at each level of the sacrificial material layers).

Figure 4:
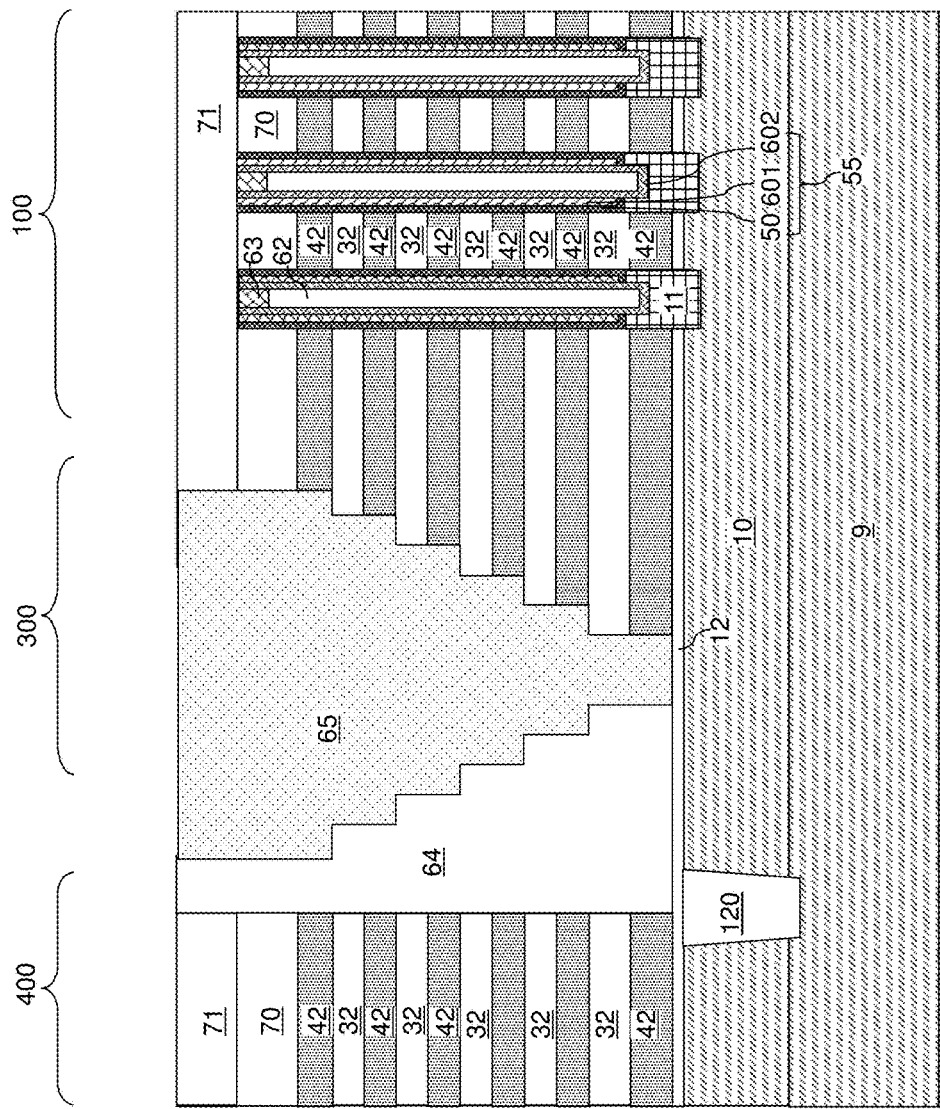
FIG. 4 is a vertical cross-sectional view of the exemplary structure after formation of a set of stepped surfaces and a retro-stepped dielectric material portion according to an embodiment of the present disclosure.

Referring to FIG. 4, an optional first contact level dielectric layer 71 can be formed over the substrate semiconductor layer 9. As an optional structure, the first contact level dielectric layer 71 may, or may not, be formed. In case the first contact level dielectric layer 71 is formed, the first contact level dielectric layer 71 includes a dielectric material such as silicon oxide, silicon nitride, silicon oxynitride, porous or non-porous organosilicate glass (OSG), or a combination thereof. If an organosilicate glass is employed, the organosilicate glass may, or may not, be doped with nitrogen. The first contact level dielectric layer 71 can be formed over a horizontal plane including the top surface of the insulating cap layer 70 and the top surfaces of the top active regions 63. The first contact level dielectric layer 71 can be deposited by chemical vapor deposition, atomic layer deposition (ALD), spin-coating, or a combination thereof. The thickness of the first contact level dielectric layer 71 can be in a range from 10 nm to 300 nm, although lesser and greater thicknesses can also be employed.

In one embodiment, the first contact level dielectric layer 71 can be formed as a dielectric material layer having a uniform thickness throughout. The first contact level dielectric layer 71 may be formed as a single dielectric material layer, or can be formed as a stack of a plurality of dielectric material layers. Alternatively, formation of the first contact level dielectric layer 71 may be merged with formation of at least one line level dielectric layer (not shown). While the present disclosure is described employing an embodiment in which the first contact level dielectric layer 71 is a structure separate from an optional second contact level dielectric layer or at least one line level dielectric layer to be subsequently deposited, embodiments in which the first contact level dielectric layer 71 and at least one line level dielectric layer are formed at a same processing step, and/or as a same material layer, are expressly contemplated herein.

In one embodiment, the first contact level dielectric layer 71, the insulating cap layer 70, and the alternating stack (32, 42) may be removed from a portion of the contact region 300 and optionally from a peripheral portion of the transistor region 400, for example, by a masked etch process. A dielectric material portion 64 can be formed by depositing a dielectric material (such as silicon oxide) in the cavities formed by removal of portions of the first contact level dielectric layer 71, the insulating cap layer 70, and the alternating stack (32, 42).

In addition, a stepped cavity can be formed within the contact region 300 by patterning a portion of the alternating stack (32, 42). As used herein, a "stepped cavity" refers to a cavity having stepped surfaces. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "step" refers to a vertical shift in the height of a set of adjoined surfaces.

The stepped cavity can have various stepped surfaces such that the horizontal cross-sectional shape of the stepped cavity changes in steps as a function of the vertical distance from the top surface of the substrate semiconductor layer 9. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating stack is defined as the relative position of a pair of a first material layer and a second material layer within the structure. After formation of all stepped surfaces, mask material layers employed to form the stepped surfaces can be removed, for example, by ashing. Multiple photoresist layers and/or multiple etch processes can be employed to form the stepped surfaces.

A dielectric material such as silicon oxide is deposited in the stepped cavity. Excess portions of the deposited dielectric material can be removed from above the top surface of the first contact level dielectric layer 71, for example, by chemical mechanical planarization (CMP). The remaining portion of the deposited dielectric material filling the stepped cavity in the contact region 300 and overlying the substrate semiconductor layer 9 constitutes a retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed as the dielectric material, the silicon oxide of the retro-stepped dielectric material portion 65 may, or may not, be doped with dopants such as B, P, and/or F. The top surface of the retro-stepped dielectric material portion 65 can be coplanar with the top surface of the first contact level dielectric layer 71.

The region over the stepped cavities can be filled simultaneously with the same dielectric material, or can be filled in different processing steps with the same dielectric material or with different dielectric materials.

Figure 5:
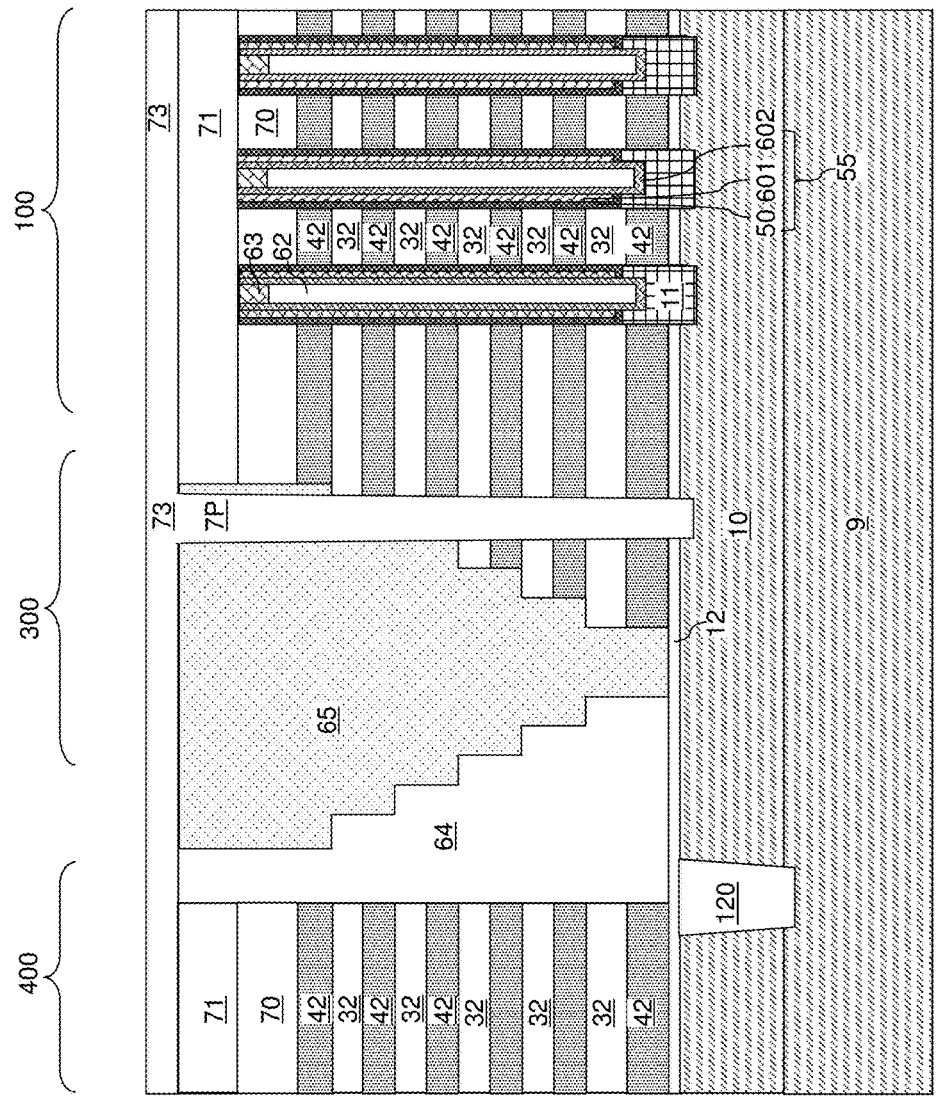
FIG. 5 is a vertical cross-sectional view of the exemplary structure after formation of dielectric pillar structures according to an embodiment of the present disclosure.

Referring to FIG. 5, dielectric support pillars 7P may be optionally formed through the retro-stepped dielectric material portion 65 and/or through the first contact level dielectric layer 71 and/or through the alternating stack (32, 42). In one embodiment, the dielectric support pillars 7P can be formed in the contact region 300, which is located adjacent to the memory region 100. The dielectric support pillars 7P can be formed, for example, by forming an opening extending through the retro-stepped dielectric material portion 65 and/or through the alternating stack (32, 42) and at least to the top surface of the substrate semiconductor layer 9, and by filling the opening with a dielectric material that is resistant to the etch chemistry to be employed to remove the sacrificial material layers 42.

In one embodiment, the dielectric support pillars 7P can include silicon oxide and/or a dielectric metal oxide such as aluminum oxide. In one embodiment, the portion of the dielectric material that is deposited over the first contact level dielectric layer 71 concurrently with deposition of the dielectric support pillars 7P can be present over the first contact level dielectric layer 71 as a second contact level dielectric layer 73. Each of the dielectric support pillars 7P and the second contact level dielectric layer 73 is an optional structure. As such, the second contact level dielectric layer 73 may, or may not, be present over the insulating cap layer 70 and the retro-stepped dielectric material portion 65. The first contact level dielectric layer 71 and the second contact level dielectric layer 73 are herein collectively referred to as at least one contact level dielectric layer (71, 73). In one embodiment, the at least one contact level dielectric layer (71, 73) can include both the first and second contact level dielectric layers (71, 73), and optionally include any additional via level dielectric layer that can be subsequently formed. In another embodiment, the at least one contact level dielectric layer (71, 73) can include only the first contact level dielectric layer 71 or the second contact level dielectric layer 73, and optionally include any additional via level dielectric layer that can be subsequently formed. Alternatively, formation of the first and second contact level dielectric layers (71, 73) may be omitted, and at least one via level dielectric layer may be subsequently formed.

The second contact level dielectric layer 73 and the dielectric support pillars 7P can be formed as a single continuous structure of integral construction, i.e., without any material interface therebetween. In another embodiment, the portion of the dielectric material that is deposited over the first contact level dielectric layer 71 concurrently with deposition of the dielectric support pillars 7P can be removed, for example, by chemical mechanical planarization or a recess etch. In this case, the second contact level dielectric layer 73 is not present, and the top surface of the first contact level dielectric layer 71 can be physically exposed.

Figure 6A:
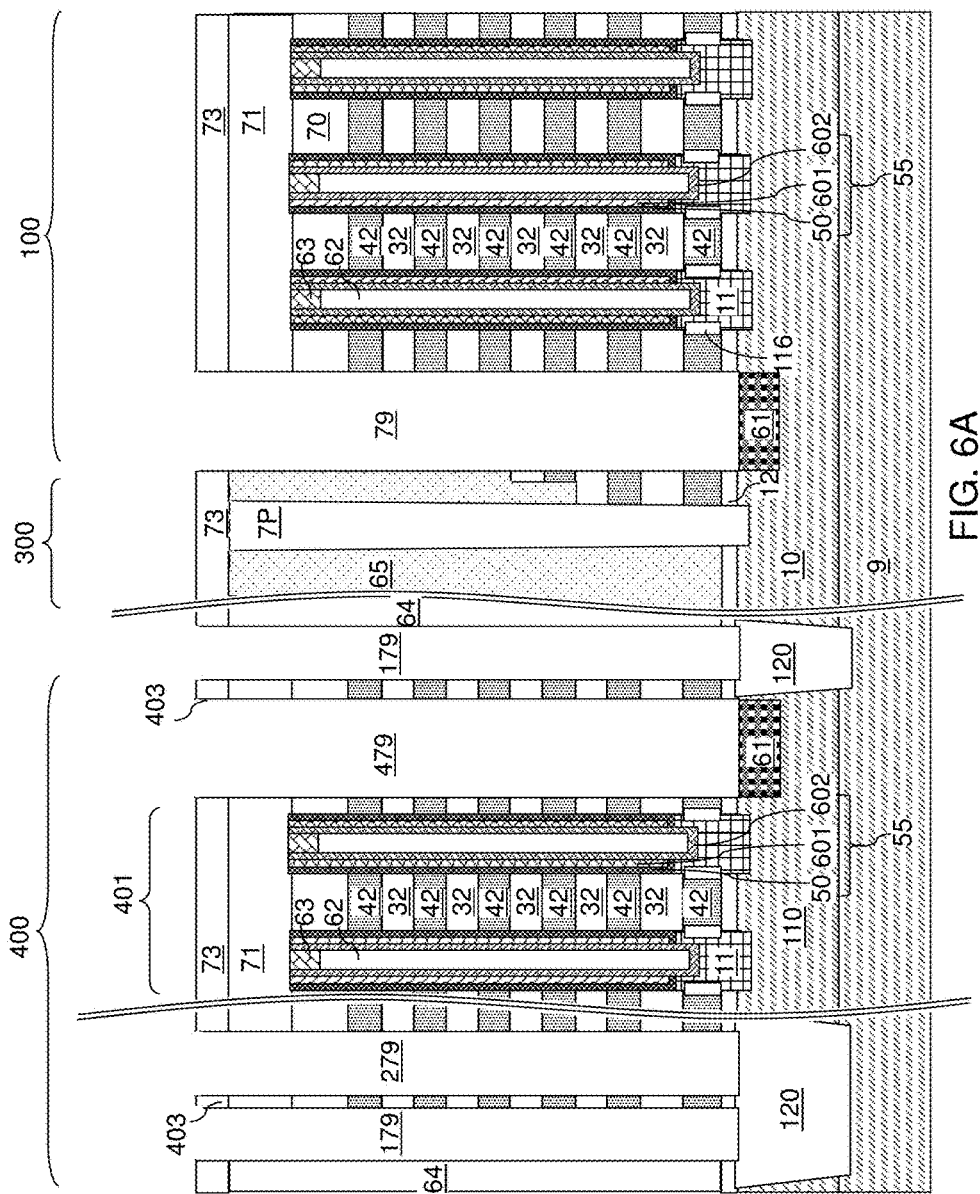
FIG. 6A is a vertical cross-sectional view along lines A-A' and A"-A" in FIG. 6B of the exemplary structure after formation of various through-stack trenches according to an embodiment of the present disclosure.
Figure 6B:
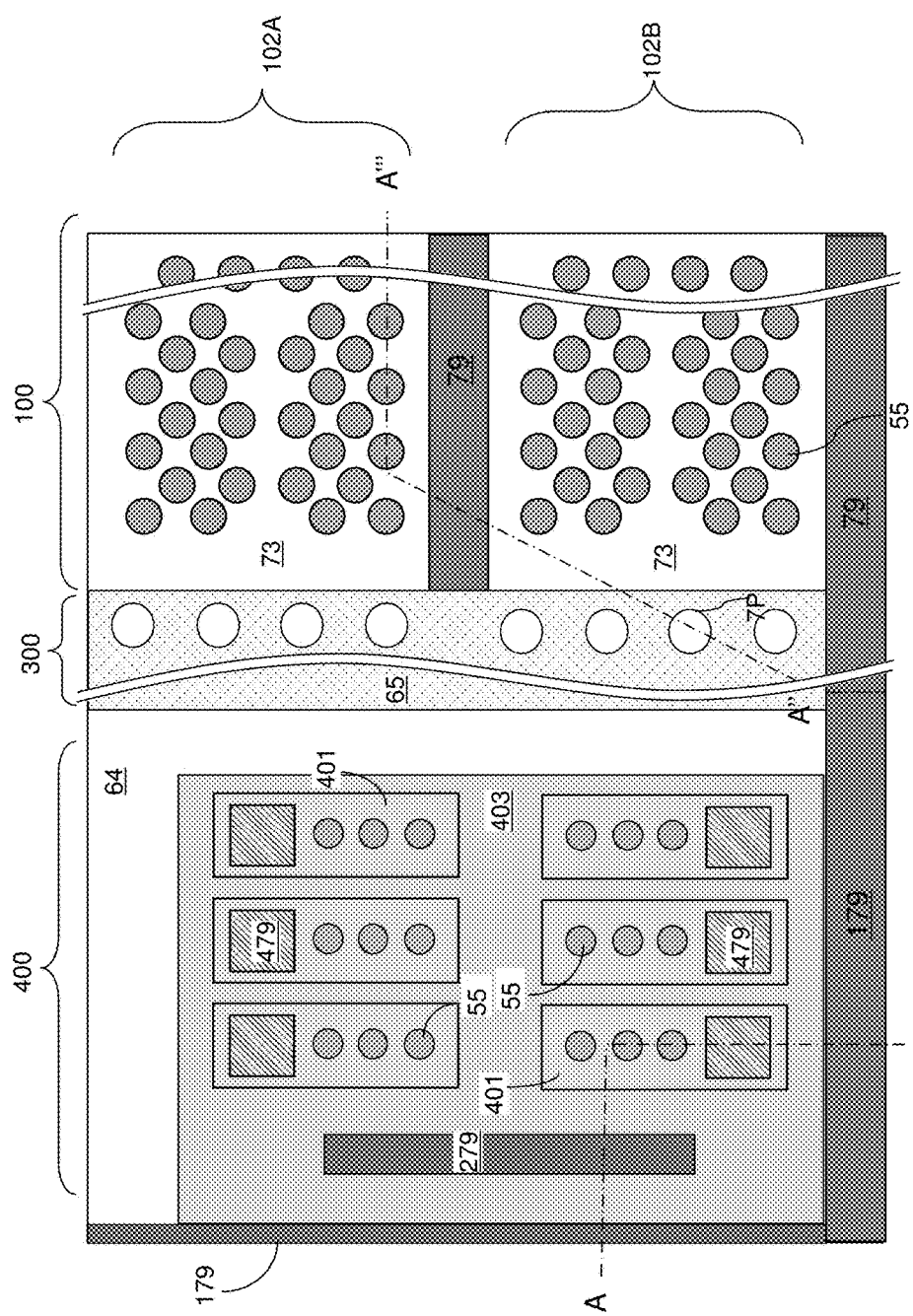
FIG. 6B is a see-through top-down view of the exemplary structure of FIG. 6A in which locations of opening fill structures are shown.

Referring to FIGS. 6A and 6B, a photoresist layer (not shown) can be applied over the at least one contact level dielectric layer (71, 73), and can be lithographically patterned to form various openings therein. The pattern of the openings in the photoresist layer can be transferred through the alternating stack (32, 42) employing an anisotropic etch to form openings that extend through the entirety of the alternating stack (32, 42), which are herein referred to as backside openings (79, 179, 279, 479).

In one embodiment, the backside openings (79, 179, 279, 479) can include openings within and/or between the memory blocks in the memory region 100, which are herein referred to as memory active region contact opening 79, i.e., a contact opening extending to an active region (i.e., a bottom active region) within the memory region 100. For example, a single memory block is shown in FIG. 6A. The memory block has two sub-blocks 102A and 102B in FIG. 6A. The memory block may have more than two sub-blocks, such as four to six sub-blocks. The word lines in each sub-block may be separated by the trenches (i.e., openings) 79. If desired, the word lines in the same vertical device level in different sub-blocks of the same memory block may be connected to each other electrically using an interconnect in the contact region 300 as will be described below with regard to FIG. 13. In one embodiment, the memory stack structures (as embodied as instances of opening fill structures 55) in the memory region 100 can be clustered to form memory blocks. In one embodiment, each memory block can be laterally spaced from one another along a horizontal direction (e.g., bit line direction). In this case, the memory active region contact opening 79 can be formed as a trench between sub-blocks of memory stack structures.

The backside openings (79, 179, 279, 479) can include openings 479 within which bottom active regions 61 of the field effect transistors in the transistor region 400 are to be subsequently formed, which are herein referred to as transistor active region contact openings 479, i.e., a contact opening extending to an active region (i.e., a bottom active region, such as a source region 61) in the transistor region 400.

Optionally, a selective semiconductor deposition process may be performed prior to implantation of the electrical dopants. A bottom active region 61 can be formed underneath each active region contact opening (79, 479), for example, by implanting electrical dopants into surface portions of the semiconductor material located underneath the active region contact openings (79, 479). Specifically, bottom active regions 61 can be formed in, or on, portions of the semiconductor well layer 10 underlying the memory active region contact opening 79 by implantation of dopants of a second conductivity type (which is the opposite of the first conductivity type) after formation of the memory active region contact opening 79. For example, if the first conductivity type is p-type, the second conductivity type is n-type, and vice versa. Each implanted doped region of the semiconductor material constitutes the bottom active regions 61.

In the transistor region 400, each bottom active region 61 can be laterally spaced from the vertical transistor channels (as embodied as instances of the semiconductor channels 60), and can be formed in, or on, the substrate (9, 10). Top active region (e.g., drain region) 63 can be formed on, and over, the vertical transistor channels at the processing steps of FIG. 2H. For any given pair of at least one top active region 63 and a bottom active region 61 for a same field effect transistor, a region selected from the at least one top active region 61 and the bottom active regions 63 can be a source region of the field effect transistor, and the other region can be a drain region of the field effect transistor.

In the memory region 100, each bottom active region 61 can be laterally spaced from the memory device channels (as embodied as instances of the semiconductor channels 60), and can be formed in, or on, the substrate (9, 10). Top active region (e.g., drain region) 63 can be formed on, and over, the memory device channels at the processing steps of FIG. 2H. For any given pair of a top active region 63 and a bottom active region 61 connected by a memory device channel, one of the top and bottom active regions (61, 63) can be a source region of the memory device and another of the top and bottom active regions (61, 63) can be a drain region of the memory device.

Optionally, the backside openings (79, 179, 279, 479) can include openings within areas surrounding isolated areas within the transistor region 400, which are herein referred to as moat trenches 179. In one embodiment, the moat trenches 179 can be formed over the area of the at least one shallow trench isolation structure 120. Each moat trench 179 can laterally enclose a region in which a field effect transistor is to be formed.

Further, the backside openings (79, 179, 279, 479) can include openings within which a gate electrode contact structures are to be subsequently formed, which are herein referred to as gate electrode contact openings 279. Each gate electrode contact opening 279 can be formed over the area of the at least one shallow trench isolation structure 120. Each gate electrode contact opening 279 can be formed in proximity to a set of at least one opening fill structure 55 that is controlled by the gate electrode contact structure to be subsequently formed within the gate electrode contact opening 279. The gate electrode contact openings 279 can be formed in the transistor region 400. In the embodiment shown in FIG. 6B, the opening 279 is an elongated trench.

In one embodiment illustrated in FIGS. 6A and 6B, each field effect transistor may be located in an active region 401. As shown in FIG. 6B, the active regions 401 may be separated from each other by an upper shallow trench isolation region 403 which comprises a dielectric material filled trench. The shallow trench isolation 403 may extend to the top sacrificial layer 42 in the stack (32, 42). Alternatively, the shallow trench isolation 403 may extend through one or more upper sacrificial layers 42 in the stack but not through the bottom and middle sacrificial layers 42 in the stack. In this case, the portions in active regions 401 of the upper electrically conductive layers to be formed in the stack will act as dummy gates for the field effect transistors because they will not be connected to the gate electrode contact structure which will be formed in the opening 279. Likewise, in the alternative embodiment, the opening 279 may extend through one or more upper and middle sacrificial layers 42 in the stack, but not through one or more lower sacrificial layers 42 in the stack. In this case, the portions in active regions 401 of the electrically conductive layers to be formed in the stack will act as dummy gates for the field effect transistors because they will not be connected to the gate electrode contact structure which will be formed in the opening 279. This would leave the portions of the middle electrically conductive layers in the active regions 401 which are electrically connected to the gate electrode contact structure to act as gate electrodes for the transistor.

Figure 6C:
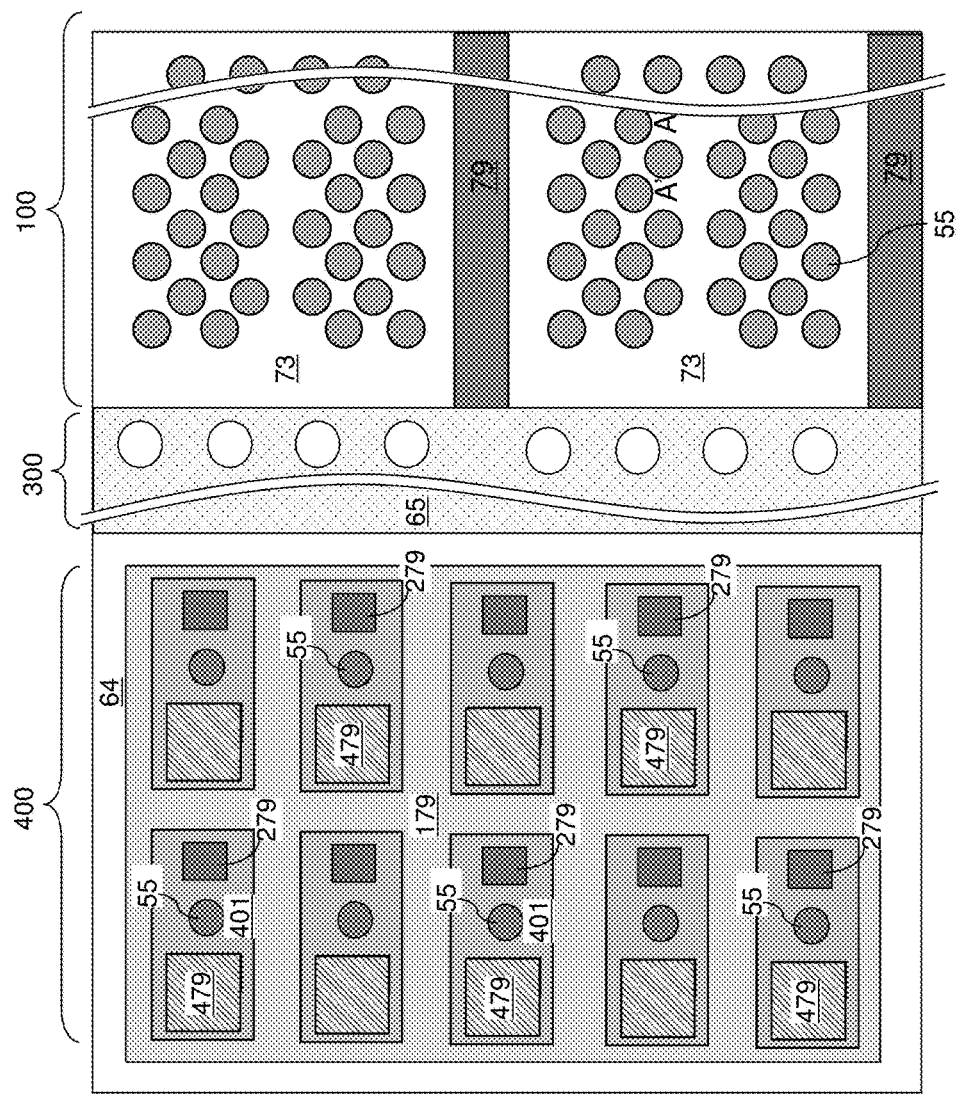
FIG. 6C is a see-through top-down view of an alternate embodiment of the exemplary structure at the processing steps of FIGS. 6A and 6B.

FIG. 6C illustrates an alternative embodiment layout in which each vertical field effect transistor employs a single opening fill structure 55, a single gate electrode contact openings 279, and a single transistor active region contact openings 479. Optionally, each set of a single opening fill structure 55, a single gate electrode contact openings 279, and a single transistor active region contact openings 479 may be located in a respective active region 401 which is laterally surrounded by a moat trench 179 so that each vertical field effect transistor to be formed is electrically isolated from one another. In contrast to the shallow trench isolation 403 of FIG. 6B, the moat trench 179 extends through all sacrificial layers 42 of the stack (32, 42). In this case, rather than all transistor gate electrodes having one common gate electrode contact structure to be formed in one trench 279, each transistor may have its own gate electrode contact structure in opening 279. The openings 279 and 479 may have any horizontal cross sectional shape, such as rectangular, circular, oval, etc.

While the present disclosure is described employing an exemplary layout for accommodating the various devices and various backside openings (79, 179, 279, 479), the layout can be modified to suit the needs of device to be formed. The shapes and widths of the various backside openings (79, 179, 379, 479) may be modified as needed. Modifications are expressly contemplated herein for providing suitable devices through optimization of the dimensions and configurations of the various backside openings (79, 179, 379, 479).

Figure 7:
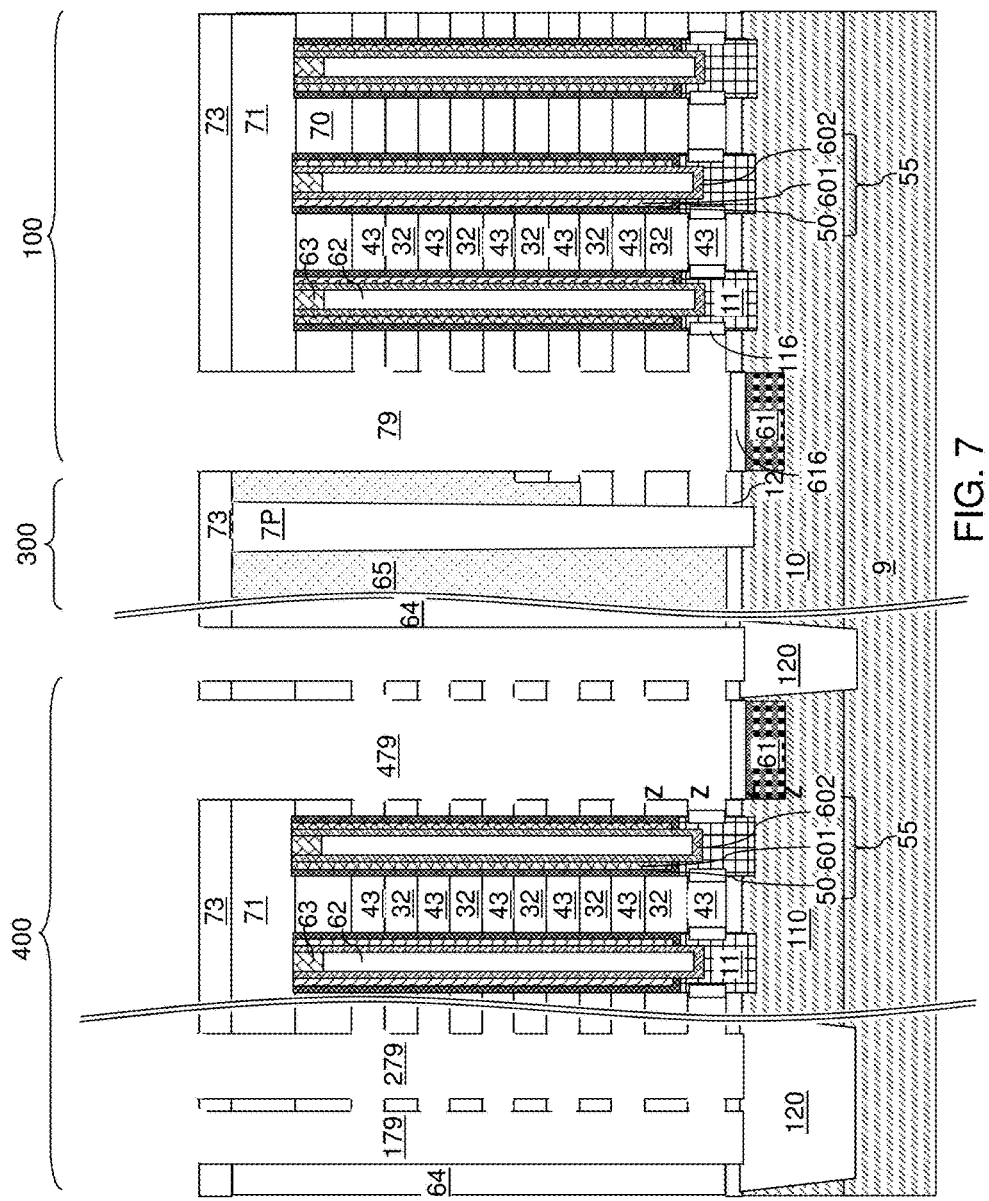
FIG. 7 is a vertical cross-sectional view of the exemplary structure after formation of backside recesses according to an embodiment of the present disclosure.

Referring to FIG. 7, an etchant that selectively etches the second material of the sacrificial material layers 42 with respect to the first material of the insulating layers 32 can be introduced into the backside openings (79, 179, 279, 479), for example, employing an etch process. Backside recesses 43 are formed in volumes from which the sacrificial material layers 42 are removed. The removal of the second material of the sacrificial material layers 42 can be selective to the first material of the insulating layers 32, the material of the dielectric support pillars 7P, the material of the retro-stepped dielectric material portion 65, the lower shallow trench isolation structure 120, the semiconductor material of the semiconductor well layer 10, and the material of the outermost layer of the first layer stacks 50. In one embodiment, the sacrificial material layers 42 can include silicon nitride, and the materials of the insulating layers 32, the dielectric support pillars 7P, the lower shallow trench isolation structure 120 and the retro-stepped dielectric material portion 65 can be selected from silicon oxide and dielectric metal oxides. In another embodiment, the sacrificial material layers 42 can include a semiconductor material such as polysilicon, and the materials of the insulating layers 32, the dielectric support pillars 7P, and the retro-stepped dielectric material portion 65 can be selected from silicon oxide, silicon nitride, and dielectric metal oxides. In this case, the depth of the backside openings (79, 179, 279, 479) can be modified so that the bottommost surfaces of the backside openings (79, 179, 279, 479) are located within the gate dielectric layer 12, i.e., to avoid physical exposure of the top surface of the substrate (9, 10).

The etch process that removes the second material selective to the first material and the outermost layer of the first layer stacks 50 can be a wet etch process employing a wet etch solution, or can be a gas phase (dry) etch process in which the etchant is introduced in a vapor phase into the backside openings (79, 179, 279, 479). For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The dielectric support pillars 7P, the retro-stepped dielectric material portion 65, and the opening fill structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The first memory openings in which the opening fill structures 55 are formed are herein referred to as front side recesses or front side cavities in contrast with the backside recesses 43. In one embodiment, the memory region 100 comprises an array of monolithic three-dimensional NAND strings having a plurality of device levels disposed above the substrate (e.g., above the substrate semiconductor layer 9). In this case, each backside recess 43 can define a space for receiving a respective word line of the array of monolithic three-dimensional NAND strings.

Each of the plurality of backside recesses 43 can extend substantially parallel to the top surface of the substrate semiconductor layer 9. A backside recess 43 can be vertically bounded by a top surface of an underlying insulating layer 32 and a bottom surface of an overlying insulating layer 32. In one embodiment, each backside recess 43 can have a uniform height throughout. Optionally, a backside outer dielectric layer can be formed in the backside recesses.

Subsequently, physically exposed surface portions of epitaxial channel portions 11 and the source regions 61 can be converted into dielectric material portions by thermal conversion and/or plasma conversion of the semiconductor materials into dielectric materials. For example, thermal conversion and/or plasma conversion can be employed to convert a surface portion of each epitaxial channel portion 11 into a dielectric spacer 116, and to convert a surface portion of each source region 61 into a sacrificial dielectric portion 616. In one embodiment, each dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The dielectric spacers 116 include a dielectric material that includes the same semiconductor element as the epitaxial channel portions 11 and additionally includes at least one non-metallic element such as oxygen and/or nitrogen such that the material of the dielectric spacers 116 is a dielectric material. In one embodiment, the dielectric spacers 116 can include a dielectric oxide, a dielectric nitride, or a dielectric oxynitride of the semiconductor material of the epitaxial channel portions 11. Likewise, each sacrificial dielectric portion 616 includes a dielectric material that includes the same semiconductor element as the source regions 61 and additionally includes at least one non-metallic element such as oxygen and/or nitrogen such that the material of the sacrificial dielectric portions 616 is a dielectric material. In one embodiment, the sacrificial dielectric portions 616 can include a dielectric oxide, a dielectric nitride, or a dielectric oxynitride of the semiconductor material of the source region 61.

Figure 8:
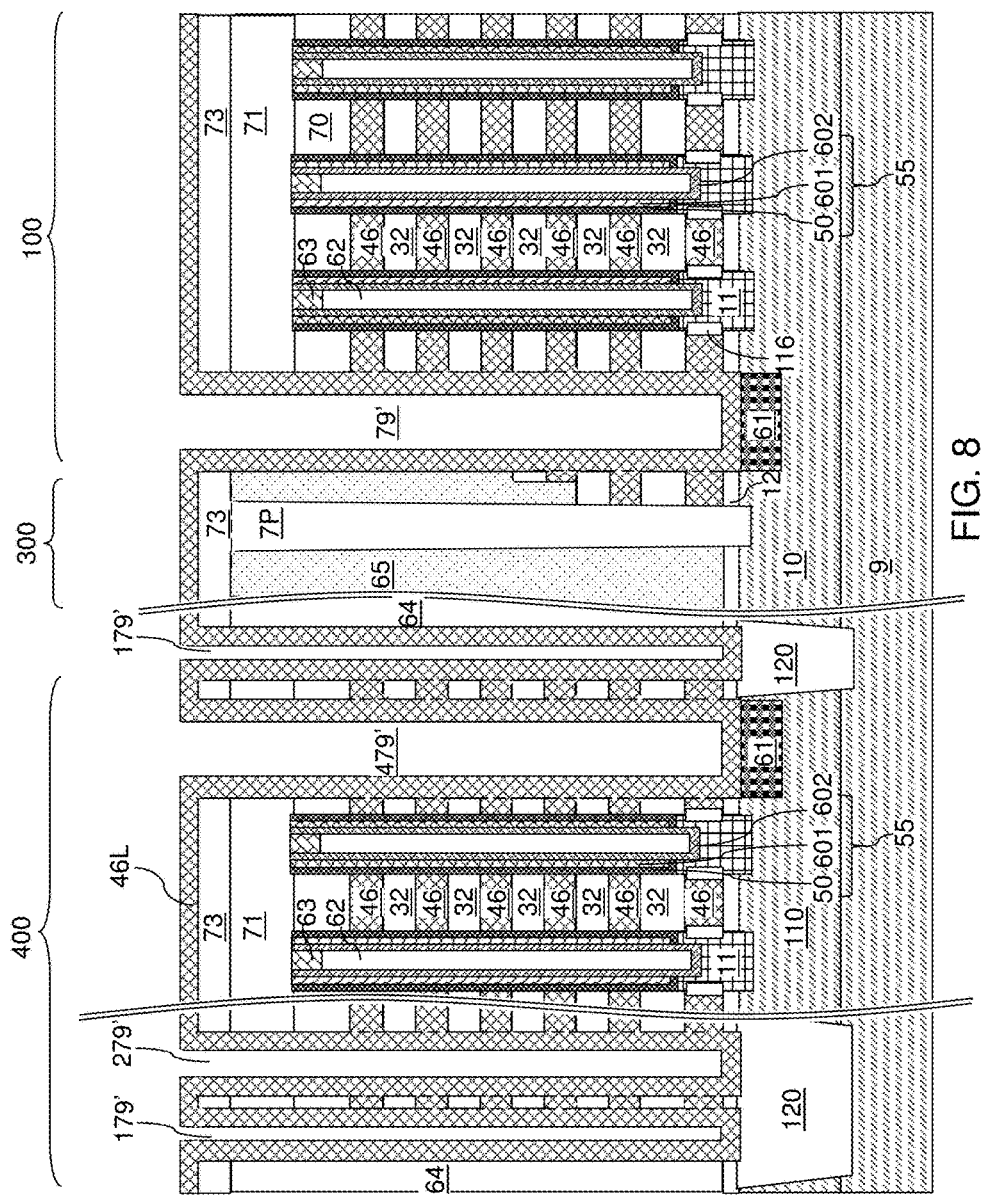
FIG. 8 is a vertical cross-sectional view of the exemplary structure after formation of electrically conductive lines according to an embodiment of the present disclosure.

Referring to FIG. 8, a backside blocking dielectric layer (not shown) can be optionally formed. The backside blocking dielectric layer, if present, comprises a dielectric material that functions as a control gate dielectric for the control gates to be subsequently formed in the backside recesses 43. In case at least one blocking dielectric is present within each opening fill structure 55, the backside blocking dielectric layer is optional. In case a blocking dielectric is not present in the opening fill structures 55, the backside blocking dielectric layer is present.

At least one metallic material can be deposited in the plurality of backside recesses 43, on the sidewalls of the backside opening (79, 179, 279, 479), and over the top surface of the second contact level dielectric layer 73. As used herein, a metallic material refers to an electrically conductive material that includes at least one metallic element.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the plurality of backside recesses 43 include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the plurality of backside recesses 43 can be a combination of titanium nitride layer and a tungsten fill material.

In one embodiment, the metallic material can be deposited by chemical vapor deposition or atomic layer deposition. In one embodiment, the metallic material can be employing at least one fluorine-containing precursor gas as a precursor gas during the deposition process. In one embodiment, the molecule of the at least one fluorine-containing precursor gas cam comprise a compound of at least one tungsten atom and at least one fluorine atom. For example, if the metallic material includes tungsten, $WF_6$ and $H_2$ can be employed during the deposition process. Alternatively, fluorine-free deposition chemistry may be employed.

A plurality of electrically conductive layers 46 can be formed in the plurality of backside recesses 43, and a contiguous metallic material layer 46L can be formed on the sidewalls of each backside opening (79, 179, 279, 479) and over the at least one contact level dielectric layer (71,73). A set of electrically shorted portions of the electrically conductive layers 46 within the transistor region 400 can constitute a gate electrode of a field effect transistor.

A portion of the continuous metallic material layer 46L within each gate electrode contact opening 279 can remain until the end of the processing sequence to provide a gate electrode contact structure. The gate electrode contact structure electrically shorts at least some of the electrically conductive layers 46 that remain in physical contact with the remaining portion of the continuous metallic material layer 46L. Each electrically conductive layer 46 subsequently become electrically isolated from one another in the memory region 100 and the contact region 300 through removal of all portions of the continuous metallic material layer 46L from the memory region 100. Thus, the electrically conductive layers 46 and the gate electrode contact structure can be formed simultaneously by deposition of the same set of at least one conductive material.

Thus, each sacrificial material layer 42 can be replaced with an electrically conductive layer 46. A backside cavity (79', 179', 279', 479') is present in the portion of each backside opening (79, 179, 279, 479) that is not filled with a backside blocking dielectric layer (if employed) and the contiguous metallic material layer 46L.

Figure 9:
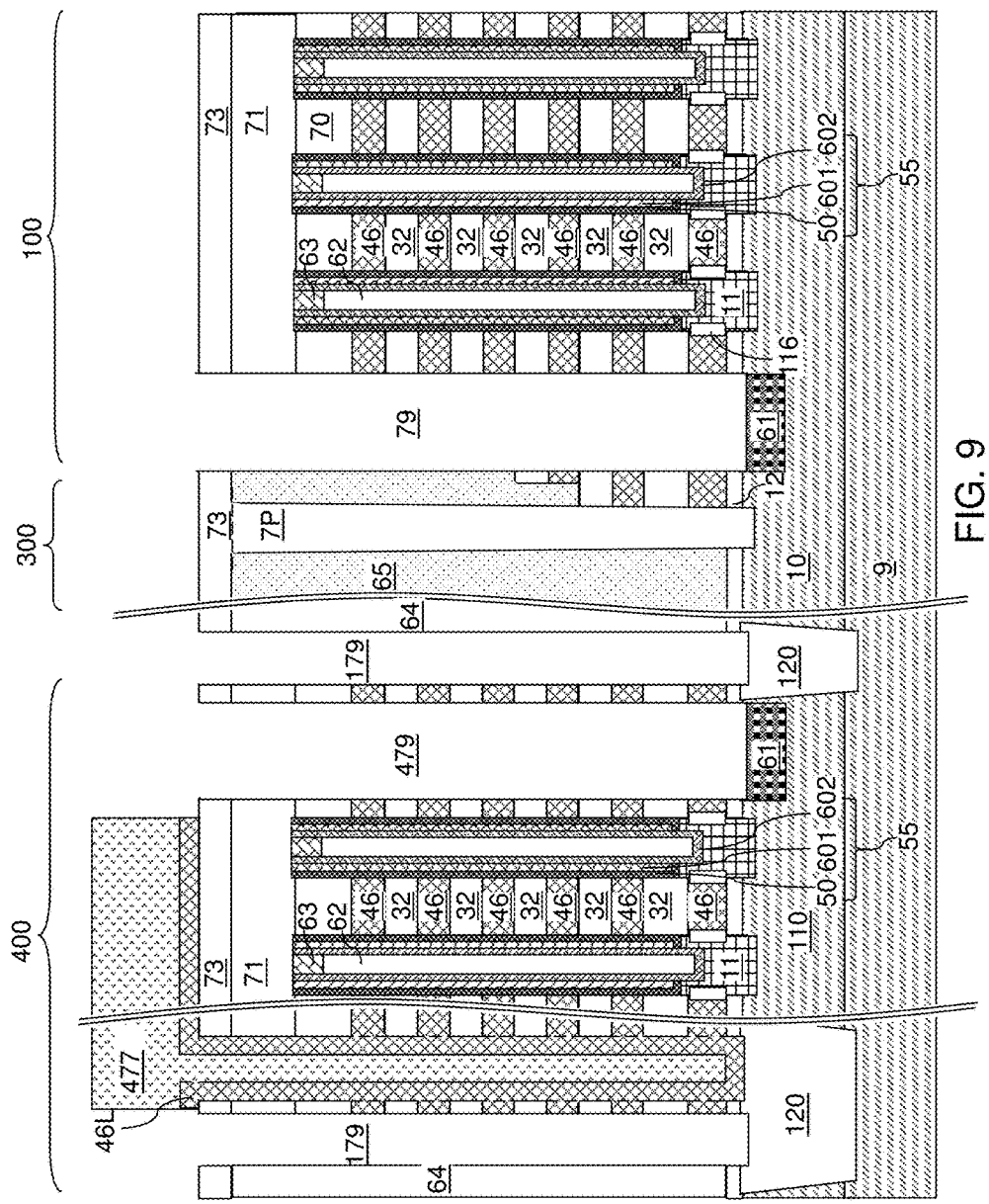
FIG. 9 is a vertical cross-sectional view of the exemplary structure after removal of conductive materials from within a subset of through-stack trenches according to an embodiment of the present disclosure.

Referring to FIG. 9, a photoresist layer 477 can be applied over the exemplary structure, and can be lithographically patterned to cover each area of the gate electrode contact opening 279. The deposited metallic material of the contiguous metallic material layer 46L is etched back from the sidewalls of each backside opening (79, 179, 479) and from above the second contact level dielectric layer 73 within areas that are not covered by the patterned photoresist layer 477.

In an alternative embodiment, if higher resistance to wet etch chemistry is desired, then a combination of a hard mask layer, such as a silicon oxide layer, and the photoresist layer 477 can be applied over the exemplary structure. The photoresist layer 477 can be lithographically patterned to cover the hard mask layer in each area of the gate electrode contact opening 279 followed by etching the hard mask layer that is not covered by the photoresist layer 477. The photoresist layer 477 layer can then be removed to leave the remaining portion of the patterned hard mask layer to cover the portion of the continuous metallic material layer 46L in gate electrode contact opening 279.

The removal of the physically exposed portions of the continuous metallic material layer 46L that are not covered by the photoresist or hard mask layer can be performed, for example, by an isotropic etch and/or an anisotropic etch except in the in gate electrode contact opening 279. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46. A portion of layer 46L covered by the photoresist or hard mask layer remains in the gate electrode contact opening 279.

Within the memory region 100, each electrically conductive layer 46 becomes electrically isolated from other electrically conductive layers 46 located at different levels. The electrically conductive layers 46 in the memory region 100 can function as a combination of a plurality of control gate electrodes located at a same level and a word line electrically interconnecting, i.e., electrically shorting, the plurality of control gate electrodes located at the same level.

The plurality of control gate electrodes within each electrically conductive layer 46 can be the control gate electrodes for the vertical memory devices including the memory stack structures, which are instances of the opening fill structures 55 in the memory region 100. In other words, each electrically conductive layer 46 in the memory region 100 can be a word line that functions as a common control gate electrode for the plurality of vertical memory devices. As such, the electrically conductive layers 46 in the memory region 100 are electrically isolated from one another, and are independently controlled with different bias voltages. Optionally, the sacrificial dielectric portions 616 can be removed from above the source regions 61 during the last processing step of the anisotropic etch. Each backside openings (79, 179, 279, 479) extends through the alternating stack (32, 46) of the insulating layers 32 and the electrically conductive layers 46 and to the top surface of the substrate (9, 10). The patterned photoresist layer 477 can be subsequently removed, for example, by ashing.

Figure 10:
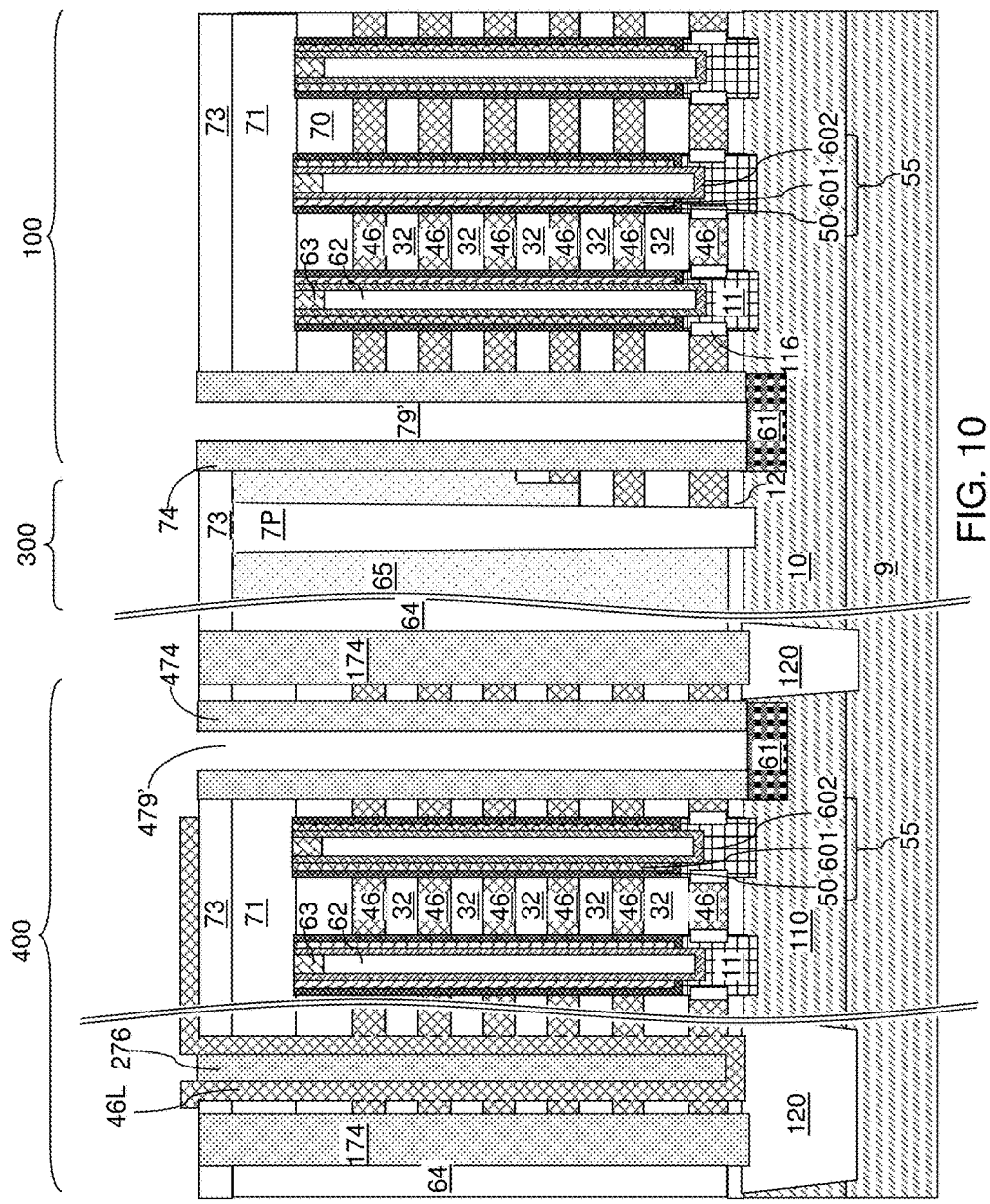
FIG. 10 is a vertical cross-sectional view of the exemplary structure after formation of dielectric material portions in through-stack trenches according to an embodiment of the present disclosure.

Referring to FIG. 10, a dielectric material can be deposited in the unfilled volumes of the backside openings (79, 179, 279, 479), for example, by a conformal deposition process. The dielectric material can include, for example, doped or undoped silicate glass, organosilicate glass, a dielectric metal nitride, and/or silicon nitride. In one embodiment, lateral dimensions of the active region contact openings (79, 479) and the moat trenches 179 can be selected such that the minimum lateral dimension between an opposing pair of sidewalls of the active region contact openings (79, 479) is greater than twice the thickness (which can be measured above the contact level dielectric layers (71, 73)) of a conformal dielectric material layer including the deposited dielectric material, and the minimum lateral dimension between an opposing pair of sidewalls of the moat trench 179 is less than twice the thickness of the conformal dielectric material layer. The dielectric material is deposited at the periphery of each active region contact opening (79, 479). In one embodiment, each cavity 279' surrounded by remaining vertical portion of the continuous metallic material layer 46L in the gate electrode contact openings 279 can be filled with the dielectric material. A vertically extending cavity (79', 479') can be present within each active region contact opening (79, 479), while each moat trench 179 is completely filled with the deposited dielectric material.

An anisotropic etch can be performed to remove horizontal portions of the deposited dielectric material from above the contact level dielectric layers (71, 73) and from above the center portions of the bottom active regions 61. Remaining vertical portions of the dielectric material in the moat trenches 179 form at least one continuous dielectric material structure. Each continuous dielectric material structure in a moat trench 179 is herein referred to as a dielectric separator structure 174, which provides lateral electrical isolation and physical separation between devices separated by the dielectric separator structure 174. The dielectric separator structure 174 laterally separates the alternating stack (32, 46) into a first alternating stack located in the memory region 100 and a second alternating stack located in the transistor region 400. The three-dimensional memory devices can be formed in memory region 100, and the field effect transistors (e.g., NAND word line switching transistors) can be is formed in the transistor region 400.

Remaining vertical portions of the deposited dielectric material in the each active region contact openings (79, 479) form insulating spacers (74, 474), which include memory region insulating spacers 74 that are formed in the memory active region contact openings 79 and transistor region insulating spacers 474 that are formed in the transistor active region contact openings 479. The thickness of each insulating spacer (74, 474), as measured at a bottom portion thereof, can be in a range from 1.5 nm to 60 nm, although lesser and greater thicknesses can also be employed. In one embodiment, the thickness of the insulating spacers (74, 474) can be in a range from 3 nm to 10 nm. Each insulating spacer (74, 474) laterally surrounds a backside cavity (79', 479') overlying a bottom active region 61. A top surface of a bottom active region 61 (e.g., a doped source region) can be physically exposed at the bottom of each cavity within an insulating spacer (74, 174). A dielectric fill material portion 276 including a remaining portion of the dielectric material can be formed within each cavity surrounded by the remaining vertical portions of the continuous metallic material layer 46L.

Figure 11:
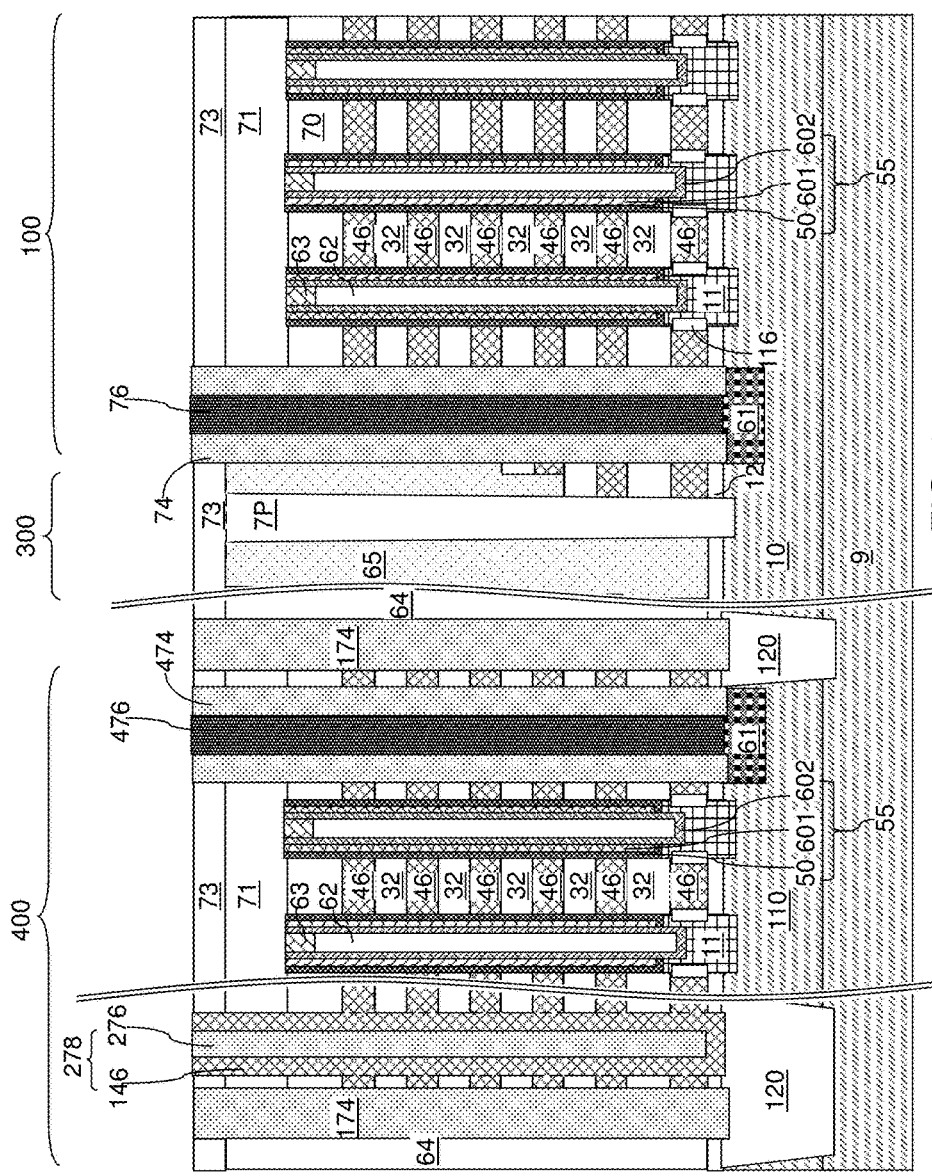
FIG. 11 is a vertical cross-sectional view of the exemplary structure after formation of dielectric material portions in through-stack trenches according to an embodiment of the present disclosure.

Referring to FIG. 11, at least one metallic material can be deposited into each backside cavity (79', 479'). The at least one metallic material can include, for example, a metallic diffusion barrier layer including a conductive metallic nitride and/or a conductive metallic carbide. Further, the at least one metallic material can include a metallic fill material such as an elemental metal (e.g., W, Co, or Al) or an intermetallic alloy of at least two elemental metals.

Excess portions of the at least one metallic material can be removed from above the horizontal plane including the top surface of the contact level dielectric layers (71, 73). Each remaining portion of the at least one metallic material in an active region contact opening (79, 479) constitutes an active region contact structure (76, 476). The active region contact structure (76, 476) may be a source electrode (e.g., a source side local interconnect) which contacts the source regions 61 in regions 100 and 400, respectively. The active region contact structures (76, 476) can include memory active region contact structures 76 and transistor active region contact structures 476. A remaining portion of the continuous metallic material layer 46L within each gate electrode contact opening 279 constitutes a gate electrode contact structure 146. Each gate electrode contact structure 146 electrically shorts at least some electrically conductive layers 46 within the same device region, and may laterally surround a dielectric fill material portion 276.

In one embodiment, each gate electrode contact structure 146 electrically shorts all electrically conductive layers 46 within the same device region (e.g., in the active region 401 or in all or part of the transistor region 400). This configuration may be achieved if the opening 279 extends through all sacrificial layers 42 in the stack. In another embodiment, each gate electrode contact structure 146 electrically shorts some but not all electrically conductive layers 46 within the same device region. This configuration may be achieved if the opening 279 does not extend through all sacrificial layers 42 in the stack and/or if the upper shallow trench isolation 403 extends through some sacrificial layers 42 in the stack, as described above. In this case, the portions of upper and/or lower electrically conductive layers 46 located in the active region 401 act as dummy gates for the field effect transistors because they are not connected to the gate electrode contact structure 146. The leaves the portions of middle electrically conductive layers 46 in the active region 401 to act as gate electrodes for the transistor.

A pair of a gate electrode contact structure 146 and a dielectric fill material portion embedded therein constitutes a gate-side structure 278. The gate-side structure 278 comprises an elongated gate-side rail structure when the opening 279 is in a shape of an elongated trench, as shown in FIG. 6B. Alternatively, the gate-side structure 278 comprises a gate-side pillar structure when the opening 279 is in a shape of a rectangle, circle or oval, as shown in FIG. 6C.

Figure 12:
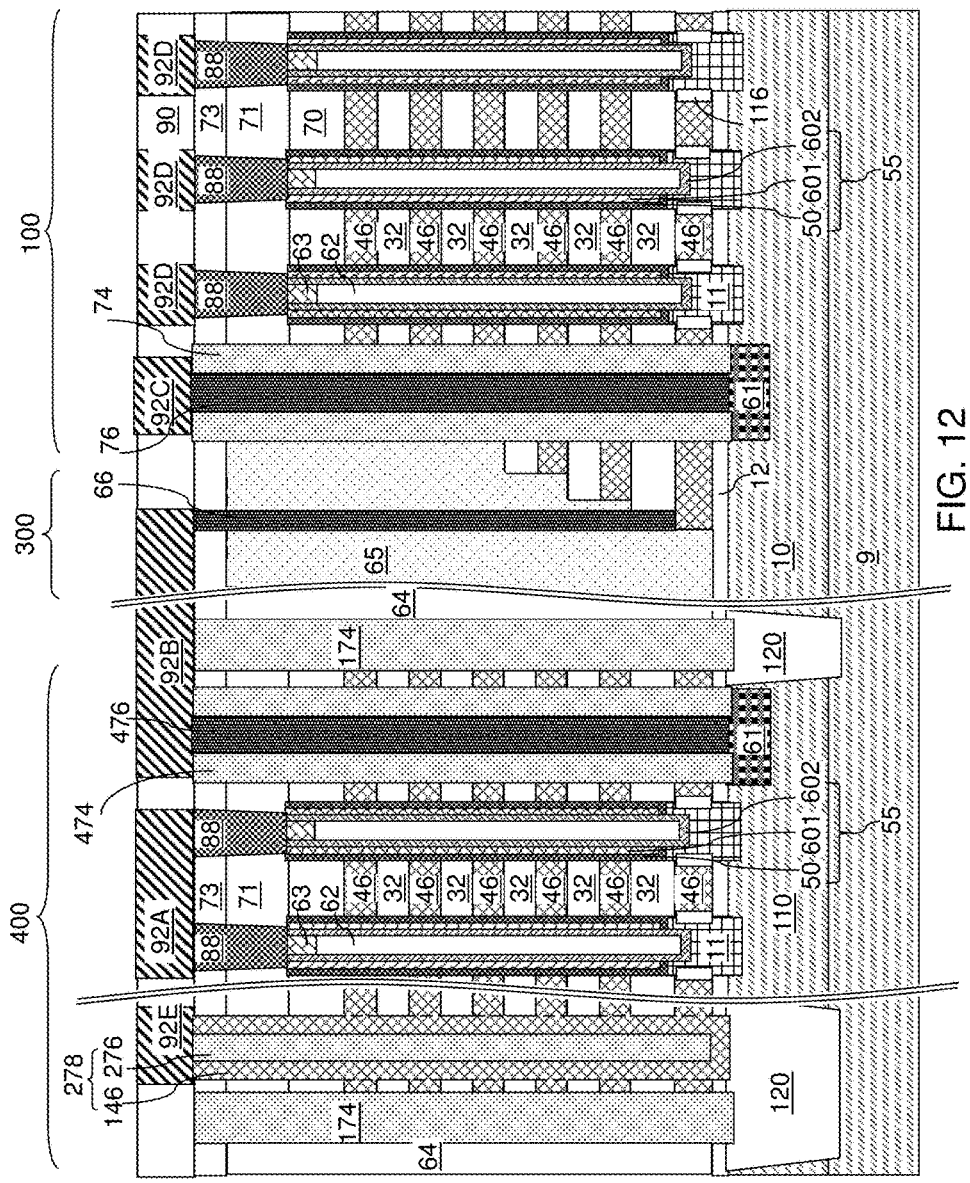
FIG. 12 is a vertical cross-sectional view of the exemplary structure after formation of metal line structures according to an embodiment of the present disclosure.

Referring to FIG. 12, a photoresist layer (not shown) can be applied over the topmost layer of the exemplary structure (which can be, for example, the second contact level dielectric layer 73), and is lithographically patterned to form various openings in the transistor region 400, and the contact region 300. The locations and the shapes of the various openings are selected to correspond to electrical nodes of the various devices to be electrically contacted by contact via structures. In one embodiment, a single photoresist layer may be employed to pattern all openings that correspond to the contact via cavities to be formed, and all contact via cavities can be simultaneously formed by at least one anisotropic etch process that employs the patterned photoresist layer as an etch mask. In another embodiment, a plurality of photoresist layers may be employed in combination with a plurality of anisotropic etch processes to form different sets of contact via cavities with different patterns of openings in the photoresist layers. The photoresist layer(s) can be removed after a respective anisotropic etch process that transfers the pattern of the openings in the respective photoresist layer through the underlying dielectric material layers and to a top surface of a respective electrically conductive structure.

In an illustrative example, top contact via cavities can be formed over each opening fill structure 55 in the transistor region 400 such that a top surface of a top active region 63 is physically exposed at the bottom of each top contact via cavity. Word line contact via cavities can be formed to the stepped surfaces of the alternating stack (32, 46) such that a top surface of an electrically conductive layer 46 is physically exposed at the bottom of each word line contact via cavity in the contact region 300. A device contact via cavity can be formed to each electrical node of the peripheral devices to be contacted by a contact via structure in the peripheral device region.

The various via cavities can be filled with at least one conductive material, which can be a combination of an electrically conductive metallic liner material (such as TiN, TaN, or WN) and a metallic fill material (such as W, Cu, or Al). Excess portions of the at least one conductive material can be removed from above the at least one contact level dielectric layer (71, 73) by a planarization process, which can include, for example, chemical mechanical planarization (CMP) and/or a recess etch. Top contact via structures 88 can be formed on the respective top active regions 63 in regions 100 and 400. Word line contact via structures 66 can be formed on the respective electrically conductive layers 46 (i.e., word lines) in the contact region 300 that extend from region 300 into the memory region 100. The support pillar 7P is omitted from FIG. 12 for clarity. Portions of layers 46 in regions 300 and 100 are electrically isolated from portions of the same respective layers 46 located in region 400. Thus, physically and electrically disconnected portions of the same electrically conductive layer 46 in the device region 100 and the transistor region 400 function as a NAND string word line/control gate and as a switching transistor gate electrode, respectively. Peripheral device (e.g., bit line switching devices or sense amp devices) contact via structures (not shown) can be formed on the respective nodes of the peripheral devices in a bit line peripheral device region (not shown).

Additional electrically conductive interconnect structures (such as metal lines 92A, 92B, 92C, 92D and 92D) and interlayer dielectric material layers (such as a line level dielectric layer 90) can be formed over the exemplary structure to provide electrical wiring among the various contact via structures. Specifically, metal lines 92A may comprise drain local interconnects in the transistor region 400. Each line 92A may interconnect the contact via structures 88 in the same active region 401 for the same transistor. In other words, each line 92A may electrically short the drain regions 63 of each multi-channel transistor in each active area 401.

Metal lines 92B may comprise word line local interconnects which electrically connect the source electrodes 476 of the transistors in region 400 to respective word line contact via structures 66 in region 300. Thus, the metal lines electrically connect the transistor source regions 61 in the transistor region 400 to the word lines 46 of the NAND device in the contact region 300. This allows the transistors to switch the word lines 46 on and off by supplying a current or voltage from the source region to the word lines.

Metal lines 92C may comprise NAND string source lines which electrically contact the source electrode (i.e., the source side local interconnect) 76. Metal lines 92D may comprise NAND string bit lines which electrically contact the drain regions 63 of each NAND string through contact via structures 88. Metal lines 92E may comprise transistor gate lines which electrically contact the gate contact structures 146 in region 400.

The exemplary structure of the present disclosure can include a device comprising a field effect transistor. The field effect transistor cam include a vertical transistor channel (as embodied as a semiconductor channel 60 (comprising layers 601, 602) in the transistor region 400) extending through an alternating stack of electrically conductive layers 46 and insulating layers 32 located over a substrate (9, 10). The electrically conductive layers 46 in the transistor region 400 can be electrically shorted among one another to provide a gate electrode. The field effect transistor can further include a gate dielectric (as embodied as a layer stack 50 within each device opening in the transistor region 400) comprising a layer stack laterally surrounding the vertical transistor channel; a gate electrode contact structure 146 extending through the alternating stack (32, 46) and contacting each of the electrically conductive layers 46 to electrically short the electrically conductive layers 46 in the transistor region 400; a bottom active region 61 located in, or on, the substrate (9, 10) and laterally spaced from the vertical transistor channel; and a top active region 63 overlying the vertical transistor channel. One of the top and bottom active regions (61, 63) is a source region of the field effect transistor, and another of the top and bottom active regions (61, 63) is a drain region of the field effect transistor.

In one embodiment, a channel of the field effect transistor comprises the vertical transistor channel and a horizontal channel portion located within the substrate (9, 10), comprising a doped semiconductor material and contacting the bottom active region 61. For example, the portion of the semiconductor well layer 10 located between a bottom active region 61 and an epitaxial channel portion 11 constitutes a horizontal channel portion of the field effect transistor. In one embodiment, the channel of the field effect transistor further comprises an epitaxial channel portion 11 comprising a doped single crystalline semiconductor material that is aligned to a single crystalline semiconductor structure of the horizontal channel portion.

In one embodiment, a shallow trench isolation structure 120 can be formed, which comprises a dielectric material embedded in an upper portion of the substrate (9, 10). A bottom surface of the gate electrode contact structure 146 can contact a top surface of the shallow trench isolation structure 120. A dielectric fill material portion 276 can vertically extend through the alternating stack, and can be laterally surrounded by the gate electrode contact structure 146. In one embodiment, a bottom active region contact structure (e.g., source electrode) 476 can extend through the alternating stack, and can contact a top surface of the bottom active region (e.g., source region) 61 in the transistor region 400. An insulating spacer 474 can laterally surround the bottom active region contact structure 476, can contact the bottom active region 61, and can comprise a dielectric material having the same composition as the dielectric fill material portion 276.

The field effect transistor may comprise at least one additional vertical transistor channel (as embodied additional instances of the semiconductor channel 60 in the transistor region 400) extending through the alternating stack; at least one additional gate dielectric (as embodied as additional instances of the layer stack 50 in the transistor region 400) comprising a respective layer stack laterally surrounding a respective vertical transistor channel and surrounded by the electrically conductive layers 46 in the transistor region 400; and at least one additional top active region 63 overlying the respective vertical transistor channel and electrically shorted to the top active region 63 by line 92A. In this case, the bottom active region 61 in the transistor region 400 can be a common source region or a common drain region for each of the vertical transistor channel and the at least one additional vertical transistor channel.

The exemplary structure can further include a three-dimensional memory device located in the memory region 100. The three-dimensional memory device can comprise a second alternating stack which is laterally spaced from the alternating stack in the transistor region 400 by the dielectric separator structure 174. The second alternating stack includes additional insulating layers 32 (separated from the insulating layers 32 of the transistor region 400 by the dielectric separator structure 174) and additional electrically conductive layers 46 (separated from the electrically conductive layers 46 of the transistor region 400 by the dielectric separator structure 174). The electrically conductive layers 46 in the memory region 100 are electrically isolated from one another and from the electrically conductive layers of the alternating stack of the field effect transistor.

The three-dimensional memory device can include at least one memory stack structure (as embodied as instances of the opening fill structures 55) vertically extending through the second alternating stack. Each of the at least one memory stack structure comprises, from inside to outside, a memory device channel (as embodied as instances of the semiconductor channel (601, 602) in the memory region 100) and a memory film (as embodied as instances of the layer stack 50 in the memory region 100). The memory film can comprise a tunneling dielectric (as embodied as an instance of the inner dielectric 506) laterally surrounding the memory device channel; and a vertical stack of charge storage regions (as embodied as portions of a memory material layer 504) laterally surrounding the tunneling dielectric.

In one embodiment, each memory film 50 in the memory region 100 can have the same sequence of material layers as the layer stack 50 of the gate dielectric of the field effect transistor in the transistor region 400. Each material layer in the sequence of the memory film can have the same thickness as a corresponding material layer in the layer stack 50 of the gate dielectric. In one embodiment, each memory device channel of the at least one memory structure and the vertical transistor channel of the field effect transistor comprise a common first semiconductor material (i.e., the semiconductor material of the semiconductor channel 60). A memory top active region (as embodied as instances of the drain region 63 in the memory region 100) can be located on top of each memory stack structure. Each memory drain region and the top active region of the field effect transistor can comprise a common second doped semiconductor material, which is the semiconductor material of the top active region 63.

In one embodiment, the device located on the semiconductor substrate can include a vertical NAND device located in the memory region 100, and at least one of the electrically conductive layers 46 in the stack (32, 46) can comprise, or can be electrically connected to, a word line of the NAND device. The memory region 100 can include a plurality of semiconductor channels (601, 602). At least one end portion of each of the plurality of semiconductor channels (601, 602) extends substantially perpendicular to a top surface of the semiconductor substrate. The memory region 100 further includes a plurality of charge storage regions located within each memory layer 50. Each charge storage region is located adjacent to a respective one of the plurality of semiconductor channels (601, 602). The memory region 100 further includes a plurality of control gate electrodes having a strip shape extending substantially parallel to the top surface of the substrate (e.g., substrate semiconductor layer 9). The plurality of control gate electrodes comprise at least a first control gate electrode located in the first device level and a second control gate electrode located in the second device level. The plurality of electrically conductive layers 46 in the stack (32, 46) can be in electrical contact with, or can comprise, the plurality of control gate electrodes, and extends from the memory region 100 to a contact region 300 including a plurality of electrically conductive contact via structures.

In case the exemplary structure includes a three-dimensional NAND device, a stack (32, 46) of an alternating plurality of word lines 46 and insulating layers 32 can be located over a semiconductor substrate. Each of the word lines 46 and insulating layers 32 is located at different levels that are vertically spaced from a top surface of the semiconductor substrate by different distances. An array of opening fill structures 55 is embedded within the stack (32, 46). Each opening fill structure 55 comprises a semiconductor channel (601, 602) and at least one charge storage region located adjacent to the semiconductor channel (601, 602). At least one end portion of the semiconductor channel (601, 602) extends substantially perpendicular to the top surface of the semiconductor substrate through the stack (32, 46).

Figure 13:
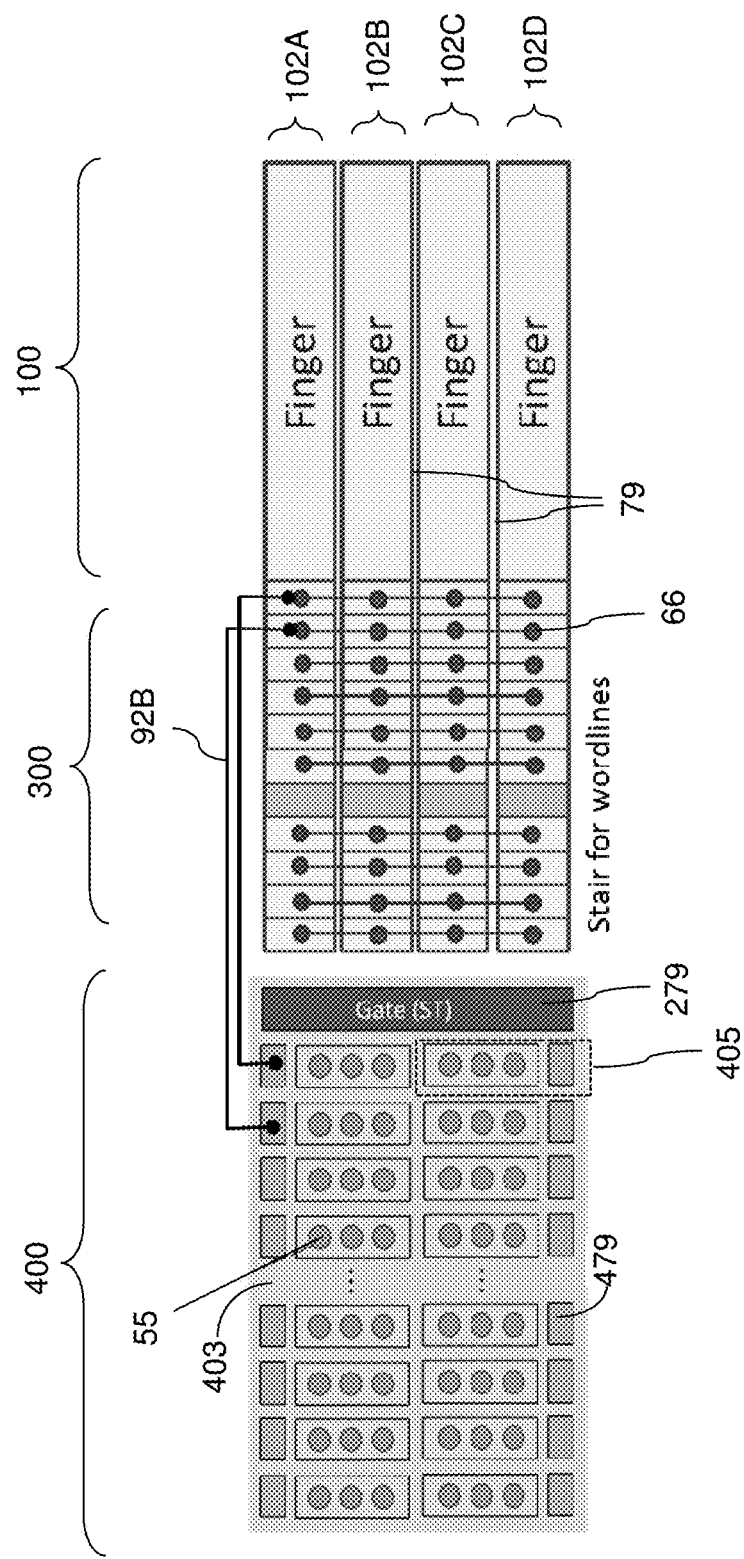
FIG. 13 is a schematic diagram that illustrates electrical connections between control gate contact via structures of a NAND device and source electrodes of vertical field effect transistors.

In an exemplary application of the vertical transistors of the present disclosure, the vertical transistors of embodiments of the present disclosure may be employed as peripheral devices, such as word line switching transistors to control the voltages applied to the control gate electrodes of a NAND memory device. FIG. 13 illustrates an exemplary configuration for accommodating the vertical transistors 405 of embodiments of the present disclosure in the transistor region 400. Memory stack structures 55 of NAND strings may be provided within each finger-shaped sub-block region 102A, 102B, 102C, 102D in the device region 100. The contact region 300 can have stepped surfaces at which electrically conductive layers 46 functioning as control gate electrodes of the NAND strings extend with different lateral extents to provide landing pad regions for control gate contact via structures 66, which can be formed, for example, through the retro-stepped dielectric material portion 65 and the optional second contact level dielectric layer 73 onto the top surfaces of each respective control gate electrodes (as embodied as the portions of the electrically conductive layers surrounding the memory stack structures). The control gate electrodes can extend along the direction of each finger as a conductive strip. Electrically conductive interconnects (e.g., metal lines) 92B can provide electrical contact between each pair of a control gate contract via structure 66 and the source electrode 476 of a respective vertical transistor of the embodiments of the present disclosure. The vertical channel switching transistors 405 are advantageous over prior art horizontal channel switching transistors due to a significant (e.g., over 90%) reduction of the area of the word line switching transistor region 400. Furthermore, the vertical transistors 405 may be formed during the same processing steps as the NAND strings, thus reducing the number of processing steps. The vertical field effect transistors of the present disclosure may be employed for any other purpose in addition to, or in lieu of, a switching device for the control gate electrodes/word lines of a NAND device.

Figure 14:
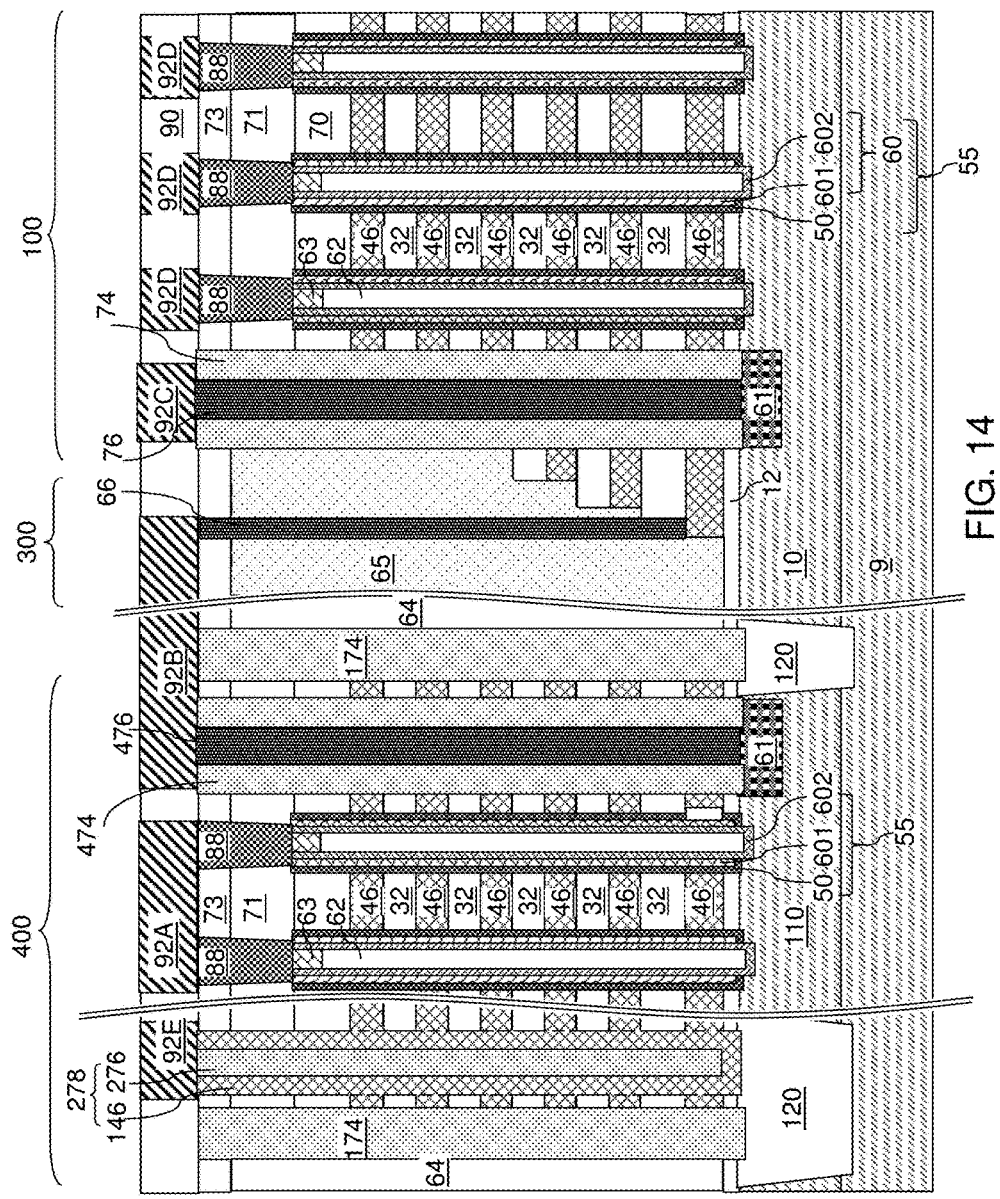
FIG. 14 is a vertical cross-sectional view of an alternate embodiment of the exemplary structure after formation of metal line structures according to an embodiment of the present disclosure.

Referring to FIG. 14, an alternate embodiment of the exemplary structure is illustrated, which can be derived from the exemplary structure by omitting the processing steps employed to form the optional epitaxial channel portions 11 to form either an enhancement mode transistor (normally on unless voltage is applied to gate electrode) or a depletion mode transistor (normally off unless voltage is applied to gate electrode). The conductivity type of the substrate semiconductor layer 9 and the semiconductor well layer 10 may be modified as appropriate. In one embodiment, the substrate semiconductor layer 9 may have a p-type doping, and the semiconductor well layer 10 may have an n-type doping (e.g., a lightly doped well, such as a N⁻ well). In one embodiment, the conductivity type of the semiconductor channel 60 may be either intrinsic or the same as the conductivity type of the semiconductor well layer 10 (e.g., n-type). The source regions 61 and the drain regions 63 may have a conductivity type that is the same as the conductivity type of the semiconductor well layer 10 (e.g., n-type) and optionally the same as that of the semiconductor channel 60 if the channel is doped rather than intrinsic. This forms a transistor having a heavily doped source region 61 of a first conductivity type (e.g., n-type, N⁺), a lightly doped horizontal channel portion in the well layer 10 of the first conductivity type (e.g., n-type, N⁻), a vertical channel portion 60 that is either intrinsic or lightly doped of the first conductivity type (e.g., n-type, N), and a heavily doped drain region 63 of the first conductivity type (e.g., n-type, N⁺). In an alternative embodiment, the conductivity types may be reversed, such that the substrate semiconductor layer 9 may have n-type doping, and the semiconductor well layer 10, the source region 61, the drain region 63 and optionally the channel 60 may have p-type doping. Thus, in both embodiments, the source region 61, the drain region 63 and the horizontal channel portion in the well layer 10 have a doping of the same first conductivity type, and the first vertical transistor channel portion 60 is either intrinsic or has a doping of the first conductivity type.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A device comprising a field effect transistor and a three-dimensional memory device,
wherein the field effect transistor comprises:
a first vertical transistor channel portion extending through a first portion of an alternating stack of electrically conductive layers and insulating layers located over a substrate, wherein at least some of the electrically conductive layers are electrically shorted among one another to provide a gate electrode;
a first gate dielectric laterally surrounding the first vertical transistor channel portion;
a gate electrode contact structure extending through the first portion of the alternating stack and contacting at least some of the electrically conductive layers to electrically short at least some of the electrically conductive layers;
a bottom active region located in, or on, the substrate and laterally spaced from the first vertical transistor channel portion; and
a first top active region overlying the first vertical transistor channel portion,
wherein one of the top and bottom active regions is a source region of the field effect transistor and another of the top and bottom active regions is a drain region of the field effect transistor,
and wherein the three-dimensional memory device comprises:
a second portion of the alternating stack of insulating layers and electrically conductive layers that are electrically isolated from one another and from the electrically conductive layers of the first portion of the alternating stack; and
at least one memory stack structure vertically extending through the second portion of the alternating stack, wherein each of the at least one memory stack structure comprises, from inside to outside, a memory device channel and a memory film.

2. The device of claim 1, wherein a channel of the field effect transistor comprises the first vertical transistor channel portion and a horizontal channel portion located in or on the substrate, comprising a doped semiconductor material and contacting the bottom active region.

3. The device of claim 2, wherein:
the channel of the field effect transistor further comprises an epitaxial channel portion comprising a doped single crystalline semiconductor material that is aligned to a single crystalline semiconductor structure of the horizontal channel portion; or
the source region, the drain region and the horizontal channel portion have a doping of the same first conductivity type, and the first vertical transistor channel portion is either intrinsic or has a doping of the first conductivity type.

4. The device of claim 1, further comprising a shallow trench isolation structure comprising a dielectric material embedded in an upper portion of the substrate, wherein a bottom surface of the gate electrode contact structure contacts a top surface of the shallow trench isolation structure.

5. The device of claim 4, further comprising a dielectric fill material portion vertically extending through each insulating layer in the first portion of the alternating stack and laterally surrounded by the gate electrode contact structure.

6. The device of claim 5, further comprising a bottom active region contact structure extending through the first portion of the alternating stack and contacting a top surface of the bottom active region.

7. The device of claim 6, further comprising an insulating spacer laterally surrounding the bottom active region contact structure, contacting the bottom active region, and comprising a dielectric material having a same composition as the dielectric fill material portion.

8. The device of claim 1, wherein the field effect transistor comprises:
a second vertical transistor channel portion extending through the first portion of the alternating stack;
a second gate dielectric laterally surrounding the second vertical transistor channel portion and surrounded by the electrically conductive layers; and
a second top active region overlying the respective second vertical transistor channel portion and electrically shorted to the first top active region.

9. The device of claim 8, wherein the bottom active region is a common source region for the first and the second transistor channel portions.

10. The device of claim 1, wherein:
the memory film comprises a tunneling dielectric laterally surrounding the memory device channel and charge storage regions laterally surrounding the tunneling dielectric;
the three-dimensional memory device comprises a three dimensional NAND device;
the field effect transistor comprises a word line switching transistor for the three dimensional NAND device;
the electrically conductive layers in the second portion of the stack comprise word lines of the three dimensional NAND device; and
at least one word line of the three dimensional NAND device is electrically connected by an interconnect to the source or drain region of the word line switching transistor.

11. The device of claim 10, wherein:
the memory film has a same sequence of material layers as the first gate dielectric of the field effect transistor;
each material layer in the sequence of the memory film has a same thickness as a corresponding material layer in the first gate dielectric;
each memory device channel of the at least one memory structure and the first vertical transistor channel portion of the field effect transistor comprise a common first semiconductor material;
a memory drain region is located on top of each memory stack structure;
each memory drain region and the first top active region comprise a common second doped semiconductor material.

12. The device of claim 10, wherein the memory film has a different sequence of material layers from the first gate dielectric of the field effect transistor.

13. The device of claim 1, further comprising:
a shallow trench isolation structure comprising a dielectric material embedded in an upper portion of the substrate; and
a dielectric separator structure laterally separating the first portion of the alternating stack and the second portion of the alternating stack.

14. The device of claim 1, wherein:
the three-dimensional memory device comprises a vertical NAND device formed in a memory region;
the electrically conductive layers in the second portion of the alternating stack comprise, or are electrically connected to a respective word line of the NAND device;
the memory region comprises:
a plurality of memory device channels, wherein at least one end portion of each of the plurality of memory device channels extends substantially perpendicular to a top surface of the substrate;
a plurality of charge storage regions, each charge storage region located adjacent to a respective one of the plurality of memory device channels; and
a plurality of control gate electrodes having a strip shape extending substantially parallel to the top surface of the substrate;
the plurality of control gate electrodes comprise at least a first control gate electrode located in a first device level and a second control gate electrode located in a second device level;
the electrically conductive layers in the second portion of the alternating stack are in electrical contact with the plurality of control gate electrodes and extend from the memory region to a contact region including the plurality of electrically conductive via connections which are electrically connected to a source region of the field effect transistor; and
the substrate comprises a silicon substrate containing a driver circuit for the NAND device.

* * * * *